United States Patent [19]

Kawai et al.

[11] Patent Number: 5,408,140
[45] Date of Patent: Apr. 18, 1995

[54] SUBSTRATE POTENTIAL GENERATING CIRCUIT GENERATING SUBSTRATE POTENTIAL OF LOWER LEVEL AND SEMICONDUCTOR DEVICE INCLUDING THE SAME

[75] Inventors: Shinji Kawai; Masaki Tsukude; Yoshito Nakaoka, all of Hyogo, Japan

[73] Assignee: Mitsubishi Denki Kabushiki Kaisha, Tokyo, Japan

[21] Appl. No.: 139,670

[22] Filed: Oct. 22, 1993

[30] Foreign Application Priority Data

Oct. 29, 1992 [JP] Japan .................. 4-291137
May 21, 1993 [JP] Japan .................. 5-119985

[51] Int. Cl.⁶ .................................. H03K 3/01
[52] U.S. Cl. ....................... 327/536; 327/534; 327/537
[58] Field of Search ............. 307/296.2, 296.4, 296.5, 307/296.8, 264, 246

[56] References Cited

U.S. PATENT DOCUMENTS

| | | | |
|---|---|---|---|
| 4,631,421 | 12/1986 | Inoue et al. | 307/296.2 |
| 4,695,746 | 9/1987 | Tobita | 307/296.2 |
| 4,733,108 | 3/1988 | Truong | 307/296.2 |
| 4,742,250 | 5/1988 | Tobita | 307/296.2 |
| 4,961,007 | 10/1990 | Kumanoya et al. | 307/296.2 |
| 4,964,082 | 10/1990 | Sato et al. | 307/296.2 |
| 4,984,206 | 1/1991 | Komatsu et al. | 307/530 |
| 5,066,870 | 11/1991 | Kobatake | 307/296.5 |
| 5,179,296 | 1/1993 | Ito | 307/296.2 |
| 5,227,675 | 7/1993 | Taguchi | 307/296.2 |
| 5,247,208 | 9/1993 | Nakayama | 307/296.2 |

FOREIGN PATENT DOCUMENTS

4323010A1 3/1994 Germany .

OTHER PUBLICATIONS

"A 80ns 5V-Dynamic RAM", by James M. Lee et al, 1979 IEEE International Solid-State Circuits Conference, pp. 142-143.

Primary Examiner—Timothy P. Callahan
Assistant Examiner—T. Lam
Attorney, Agent, or Firm—Lowe, Price, LeBlanc & Becker

[57] ABSTRACT

A substrate potential generating circuit can generate a lower substrate potential. The substrate potential generating circuit includes a clock signal generating circuit and first and second charge pump circuits. The first charge pump circuit including a p-channel MOS transistor having its source electrode connected to the semiconductor substrate applies a first negative potential to the drain electrode by capacitive coupling of a capacitor. The second charge pump circuit including first and second sub-charge pump circuit applies a third negative potential to the gate electrode when the first negative potential is applied to the drain electrode, and thereafter provides a second potential by lowering the third potential. As a result, the p-channel MOS transistor is turned on until a substrate potential is brought into a potential equal to the first potential applied to the drain electrode, lowering the substrate potential to the first potential.

4 Claims, 11 Drawing Sheets

SUBSTRATE POTENTIAL GENERATING CIRCUIT GENERATING SUBSTRATE POTENTIAL OF LOWER LEVEL AND SEMICONDUCTOR DEVICE INCLUDING THE SAME

BACKGROUND OF THE INVENTION

1. Field of the Invention

The present invention relates to substrate potential generating circuits and semiconductor devices including the same, and particularly to a circuit applying a negative substrate potential to a p-type semiconductor substrate and a semiconductor device including the same.

2. Description of the Background Art

FIG. 10 is a schematic diagram showing one example of a conventional substrate potential generating circuit employed in a dynamic random access memory (DRAM) and the like. Referring to FIG. 10, the substrate potential generating circuit includes an oscillating circuit 30 and a charge pump circuit 40.

Oscillating circuit 30 includes an odd number of inverters 31 connected in series. The output terminal of the last inverter 31 connected to the input terminal of the first inverter 31. Respective inverters 31 are connected to a power supply potential node 10 supplied with a power supply $V_{CC}$, and to a ground potential node 20 whose potential is a ground potential. Oscillating circuit 30 is thus constituted of a ring oscillator for providing a clock signal $\Phi_{cp}$.

Charge pump circuit 40 includes an inverter 41, capacitors 42 and 43, and p-channel MOS transistors 45, 46 and 47. Inverter 41 receives the clock signal $\Phi_{cp}$ from oscillating circuit 30 to provide an inverted signal $/\Phi_{cp}$ of the clock signal $\phi_{cp}$. One electrode of capacitor 42 receives the inverted signal $/\Phi_{cp}$, and the other electrode thereof is connected to a first node 50. One electrode of capacitor 43 receives the clock signal $\Phi_{cp}$, and the other electrode thereof is connected to a second node 44.

p-channel MOS transistor 45 is connected between second node 44 and ground potential node 20, and has its gate electrode connected to ground potential node 20. P-channel MOS transistor 46 is connected between first node 50 and ground potential node 20, and has its gate electrode connected to second node 44. p-channel MOS transistor 47 is connected between first node 50 and the p-type semiconductor substrate, and has its gate electrode connected to first node 50. Specifically, p-channel MOS transistor 47 is diode-connected, so as to allow conduction between first node 50 and the semiconductor substrate when a potential $N_1$ of first node 50 is lower than a substrate potential $V_{BB}$ of the semiconductor substrate by an absolute value $V_{th}$, or more, of the threshold voltage.

Charge pump circuit 40 thus receives the clock signal $\Phi_{cp}$ from oscillating circuit 30 to provide first node 50 with a prescribed negative potential, drawing off charges in the semiconductor substrate.

FIG. 11 is a cross sectional view showing a part of a semiconductor substrate on a main surface of which such a substrate potential generating circuit is formed. Referring to FIG. 11, the substrate potential generating circuit includes a p-type semiconductor substrate 50, an N-well 51, a P-well 52, an element isolation region 53, a source/drain 54, a backgate electrode 55, and a gate electrode 56.

N-well 51 is formed by implanting a donor, such as phosphorus, in p-type semiconductor substrate 50. P-well 52 is formed by implanting an acceptor, such as boron, in p-type semiconductor substrate 50. Element isolation region 53 formed of a thick oxide film isolates adjacent elements. Source/drain 54 is formed by implanting an acceptor, such as boron, in N-well 51. Back gate electrode 55 for applying a backgate potential to N-well 51 is formed by implanting a donor, such as arsenic, in N-well 51.

The operation of the substrate potential generating circuit will now be described with reference to FIG. 12.

Referring to FIG. 12(a), oscillating circuit 30 provides a clock signal $\Phi_{cp}$ changing periodically between an H level (a power supply potential $V_{CC}$) and an L level (a ground potential GND). A substrate potential $V_{BB}$ of the semiconductor substrate is assumed to be approximately the ground potential at a timing $t_0$ when the clock signal $\Phi_{cp}$ rises from an L level to an H level.

When the clock signal $\Phi_{cp}$ rises from an L level to an H level at the timing $t_0$, a potential $N_2$ of second node 44 rises, as shown in FIG. 12(d), by capacitive coupling of capacitor 43 receiving the clock signal $\phi_{cp}$. When the potential $N_2$ of second node 44 exceeds an absolute value $V_{th1}$ of the threshold voltage of p-channel MOS transistor 45, however, p-channel MOS transistor 45 is rendered conductive. Accordingly, second node 44 and ground potential node 20 conduct, so that the potential $N_2$ of second node 44 is the absolute value $V_{th1}$ of the threshold voltage of p-channel MOS transistor 45. As a result, p-channel MOS transistor 46, the gate electrode of which receives the potential $N_2$ of second node 44 is rendered non-conductive.

As shown in FIG. 12(b), inverter 41 receives the clock signal $\Phi_{cp}$ from oscillating circuit 30 to provide an inverted signal $/\Phi_{cp}$. When the inverted signal $/\Phi_{cp}$ falls from an H level to an L level at the time $t_0$, a potential $N_1$ of first node 50 drops to a negative potential $-k_1 V_{CC}$, as shown in FIG. 12(c), by capacitive coupling of capacitor 42 receiving the inverted signal $/\Phi_{cp}$. Here, $k_1$ is a coupling efficiency between capacitor 42 and first node 50.

When the potential $N_1$ of first node 50 attains $k_1 V_{CC}$, p-channel MOS transistor 47 is rendered conductive, allowing conduction between first node 50 and the semiconductor substrate, so that charges move from the semiconductor substrate to first node 50. The substrate potential $V_{BB}$ of the semiconductor substrate slightly drops from the ground potential GND, as shown in FIG. 12(e), because of the large capacity of the substrate. The potential $N_1$ of first node greatly rises from $-k_1 V_{CC}$ compared with the potential $V_{BB}$, as shown in FIG. 12(c), because of the small capacity of node 50. When the potential $N_1$ of first node 50 is lower than the substrate potential $V_{BB}$ by an absolute value $V_{th2}$ of the threshold voltage of p-channel MOS transistor 47, p-channel MOS transistor 47 is rendered non-conductive.

As shown in FIG. 12(a), when the clock signal $\Phi_{cp}$ from oscillating circuit 30 falls from an H level to an L level at a timing $t_1$, the potential $N_2$ of second node 44 begins to drop from the potential $V_{th1}$, as shown in FIG. 12(d), by capacitive coupling of capacitor 43 receiving the clock signal $\Phi_{cp}$, rendering p-channel MOS transistor 45 non-conductive. The potential $N_2$ of second node 44 attains $(-kV_{CC}+V_{th1})$, so that p-channel MOS transistor 46 whose gate receives the potential $N_2$ of second node 44 is rendered conductive. When p-channel MOS transistor 46 is rendered conductive, first node 50 and ground potential node 20 conduct, so that the potential $N_1$ of first node 50 attains the ground potential GND, as shown in FIG. 12(c), and p-channel MOS transistor 47 is held non-conductive.

As shown in FIG. 12(b), the inverted signal/$\Phi_{cp}$ provided from inverter 41 rises from an L level to an H level at the timing $t_1$. However, the potential $N_1$ of first node 50 will not rise by capacitive coupling of capacitor 42, since p-channel MOS transistor 46 is in the conductive state, allowing conduction between first node 50 and ground potential node 20.

As shown in FIG. 12(a), when the clock signal $\Phi_{cp}$ rises from an L level to an H level again at a timing $t_2$, the potential $N_2$ of second node 44 rises from the potential $(-k_2 V_{CC}+V_{th1})$, as shown in FIG. 12(d), by capacitive coupling of capacitor 43 receiving the clock signal $\Phi_{cp}$. However, when the potential $N_2$ of second node 44 exceeds the absolute value $V_{th1}$ of the threshold voltage of p-channel MOS transistor 45, p-channel MOS transistor 45 is rendered conductive, allowing conduction between second node 44 and ground potential node 20. Accordingly, the potential $N_2$ of second node 44 is the absolute value $V_{th1}$ of the threshold voltage of p-channel MOS transistor 45, so that p-channel MOS transistor 46 whose gate receives the potential $N_2$ of second node 44 is rendered no-conductive.

As shown in FIG. 12(b), when the inverted signal/$\Phi_{cp}$ falls from an H level to L level at the timing $t_2$, the potential $N_1$ of first node 50 drops to the negative potential $-k_1 V_{CC}$, as shown in FIG. 12(c), by capacitive coupling of capacitor 42 receiving the inverted signal/$\Phi_{cp}$, rendering p-channel MOS transistor 47 conductive. This allows conduction between first node 50 and the semiconductor substrate, whereby charges move from the semiconductor substrate to first node 50. The substrate potential $V_{BB}$ of the semiconductor substrate slightly drops from the potential at that time, as shown in FIG. 12(e), because of the large capacity of the substrate. The potential $N_1$ of first node 50 greatly rises, as shown in FIG. 12(c), because of the small capacity of the node, and when the potential $N_1$ attains a potential lower than the substrate potential $V_{BB}$ by the absolute value $V_{th2}$ of the threshold voltage of p-channel MOS transistor 47, p-channel MOS transistor 47 is rendered non-conductive.

As described above, the substrate potential $V_{BB}$ of the semiconductor substrate drops for each rise of the clock signal $\Phi_{cp}$ from oscillating circuit 30 from an L level to an H level, to finally attain $(-k_1 V_{CC}+V_{th2})$.

However, the absolute value $V_{th2}$ of the threshold voltage of p-channel MOS transistor 47, when its gate width is 0.5 μm, for example, will be 1.7V, considering a backgate effect. Since the absolute value $V_{th2}$ of the threshold voltage of p-channel MOS transistor 47 attains a large value over 1V, the problem of insufficient decrease of the substrate potential $V_{BB}$ arises.

Generally, the level required as the substrate potential $V_{BB}$ is not defined to a single value, varying depending on the kind of the device. Accordingly, a substrate potential generating circuit capable of wide selection of the substrate potential $V_{BB}$ is desirable.

Specifically, when the power supply potential $V_{CC}$ is low, for example, 3.3V, the substrate potential $V_{BB}$ is no more than $-1.6V$ ($=-3.3+1.7$), assuming that coupling efficiency $k_2$ is approximately "1". Therefore, where $-1.5V$ is required as the substrate potential $V_{BB}$, the substrate potential ($-1.5V$) approximates to the substrate potential $V_{BB}$ ($-1.6V$) obtained by the conventional substrate potential generating circuit, thus approximates to the limit of its capability. Accordingly, in the case of a sub-leak current, it may be difficult even to ensure the potential of $-1.6V$. In the conventional substrate potential generating circuit, effects of the absolute value $V_{th2}$ of the threshold voltage of p-channel MOS transistor 47 cannot be ignored, as the power supply potential $V_{CC}$ decreases.

In order to make the substrate potential $V_{BB}$ lower, the H level of the clock signal $\Phi_{cp}$ can be considered to be made higher than the power supply potential $V_{CC}$. In this case, however, a potential difference $\{(1+k_2)V_{CC}-V_{th1}\}$ is applied as stress between gate electrode 56 of p-channel MOS transistor 46 and N-well 51, as well as a potential difference $\{(1+k_1)V_{CC}-V_{th2}\}$ is applied as stress between source electrode 54 connected to semiconductor substrate 50 of p-channel MOS transistor 47 and N-well 51, causing adverse effects on the reliability of each element.

SUMMARY OF THE INVENTION

One object of the present invention is to provide a substrate potential generating circuit capable of generating a lower substrate potential of a semiconductor substrate.

Another object of the present invention is to prevent voltage drop by a p-channel MOS transistor in a switching element, thereby reducing a substrate potential to $-k_1 V_{CC}$ which is approximately equal to a potential of the opposite polarity of that supplied to the substrate potential generating circuit.

Still another object of the present invention is to provide a semiconductor device including a substrate potential generating circuit capable of generating a lower substrate potential on a semiconductor substrate.

A further object of the present invention is to provide a semiconductor device including a substrate potential generating circuit capable of generating a predetermined substrate potential.

The substrate potential generating circuit for applying a potential to a semiconductor substrate in accordance with one aspect of the present invention includes a first charge pump circuit and a control circuit. The first charge pump circuit includes a switching element having one conductive terminal connected to the semiconductor substrate. The control circuit controls the switching element so as to be turned on for a predetermined period, thereby applying a potential generated on the other conductive terminal as it is to one conductive terminal.

The substrate potential generating circuit for applying a potential to a semiconductor substrate in accordance with another aspect of the present invention includes a first charge pump circuit and a second charge pump circuit. The first charge pump circuit, which includes a switching element having one conductive terminal connected to the semiconductor substrate, applies a prescribed potential to the other conductive terminal of the switching element. The second charge pump circuit turns on the switching element during the whole or a part of the period when the prescribed potential is applied to the other conductive terminal of the switching element, thereby allowing conduction between the conductive terminals.

The substrate potential generating circuit in accordance with still another aspect of the present invention includes a first charge pump circuit and a control circuit. The first charge pump circuit includes a p-channel MOS transistor having its source electrode connected to a semiconductor substrate and an applying circuit for applying a first negative potential to the drain electrode of the p-channel MOS transistor. The control circuit applies a second negative potential lower than the first negative potential to the gate electrode of the p-channel MOS transistor for a predetermined period.

In the substrate potential generating circuit in accordance with the present invention, the control circuit includes a second charge pump circuit applying a second negative potential, which is lower than the first negative potential at least by the absolute value of the threshold voltage of the p-channel MOS transistor, to the gate electrode of the p-channel MOS transistor during the whole or a part of the period when the first negative potential is applied to the drain electrode of the p-channel MOS transistor, so as to turn on the p-channel MOS transistor, allowing conduction between the source electrode and the drain electrode.

In the substrate potential generating circuit in accordance with the present invention, the second charge pump circuit includes a first sub-charge pump circuit and a second sub-charge pump circuit. The first sub-charge pump circuit applies a third negative potential to the gate electrode of the p-channel MOS transistor. The second sub-charge pump circuit applies to the gate electrode of the p-channel MOS transistor the second negative potential lower than the third negative potential applied to the gate electrode of the p-channel MOS transistor, and lower than the first negative potential applied to the drain electrode of the p-channel MOS transistor at least by the absolute value of the threshold voltage of the p-channel MOS transistor.

The substrate potential generating circuit for applying a potential to a semiconductor substrate in accordance with a further aspect of the present invention includes a first charge pump circuit and a second charge pump circuit. The first charge pump circuit includes a switching element having one conductive terminal connected to the semiconductor substrate, and being turned on when the potential of the other conductive terminal is shifted from the potential of the semiconductor substrate by a prescribed threshold voltage. The second charge pump circuit applies a first potential to the other conductive terminal of the switching element. The first charge pump circuit shifts the first potential applied to the other conductive terminal of the switching element, thereby applying to the other conductive terminal of the switching element a second potential shifted from the potential to be applied to the semiconductor substrate at least by the threshold voltage of the switching element.

The substrate potential generating circuit in accordance with still further aspect of the present invention includes a first charge pump circuit and a second charge pump circuit. The first charge pump circuit includes a p-channel MOS transistor having its drain electrode and its gate electrode connected to each other and its source electrode connected to the semiconductor substrate. The second charge pump circuit applies a first negative potential to the drain electrode and the gate electrode of the p-channel MOS transistor. The first charge pump circuit further includes an applying circuit applying to the drain electrode and the gate electrode of the p-channel MOS transistor a second negative potential lower than the first negative potential applied to the drain electrode and the gate electrode of the p-channel MOS transistor, and lower than the potential to be applied to the semiconductor substrate at least by the absolute value of the threshold voltage of the p-channel MOS transistor.

The semiconductor device in accordance with still further aspect of the present invention includes an internal circuit and a substrate potential generating circuit. The internal circuit includes an n-channel MOS transistor formed on a semiconductor substrate. The substrate potential generating circuit is formed on the semiconductor substrate, and includes an output node and an applying circuit. The output node is connected to the semiconductor substrate through a wiring. The applying circuit responds to a power supply potential to apply to the output node a negative potential having the absolute value equal to that of the power supply potential.

The semiconductor device in accordance with the present invention further includes a cramp circuit formed on the semiconductor substrate for preventing the potential of the semiconductor substrate from decreasing to a predetermined potential or less.

Accordingly, in the substrate potential generating circuit according to the present invention, when a first potential is applied to the drain electrode of the p-channel MOS transistor, a second potential is applied to the gate electrode thereof, so that the p-channel MOS transistor is turned on, whereby the potential of the semiconductor substrate connected to the source electrode thereof can be reduced to the first potential. This enables wide selection of the substrate potential, and rapid attainment of the substrate potential to a required potential unless the required potential approximates to the limit of capabilities of the substrate potential generating circuit. Additionally, even in the case of a low power supply potential, a sufficiently low substrate potential can be obtained.

In the substrate potential generating circuit according to the present invention, after a third potential is once applied to the gate electrode of the p-channel MOS transistor, the third potential is reduced, thereby providing the second potential, so that a potential having the opposite polarity of that of the power supply potential can be obtained simply by application of a single power supply potential.

In the substrate potential generating circuit according to the present invention, after the first potential is applied to the drain electrode of the diode-connected p-channel MOS transistor whose source electrode is connected to the semiconductor substrate, the first potential is reduced, thereby providing the second potential, so that the p-channel MOS transistor is turned on, whereby a sufficiently low substrate potential can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A substrate potential generating circuit in accordance with the present invention will now be described in detail with reference to the drawings.

FIRST EMBODIMENT

Figure 1:
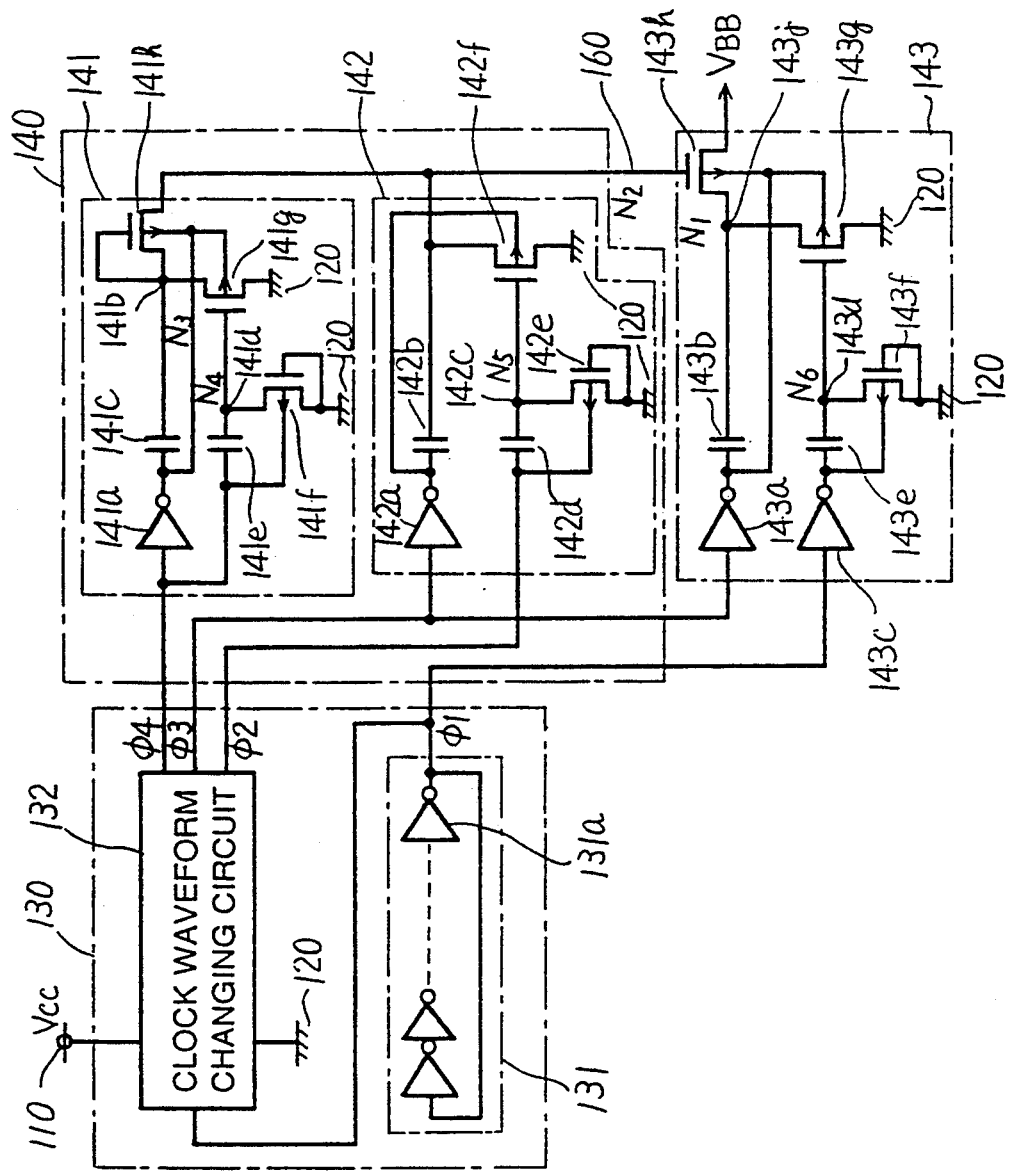
FIG. 1 is a schematic diagram showing the entire structure of substrate potential generating circuit in accordance with a first embodiment of the present invention.

FIG. 1 is a schematic diagram showing the entire structure of a substrate potential generating circuit in accordance with a first embodiment of the present invention.

Referring to FIG. 1, the substrate potential generating circuit includes a clock signal generating circuit 130, a first charge pump circuit 143 and a second charge pump circuit 140.

Clock signal generating circuit 130 includes an oscillating circuit 131 constituted of a ring oscillator providing a first clock signal $\Phi_1$, and a clock waveform changing circuit 132 receiving the first clock signal $\Phi_1$ to provide a second clock signal $\Phi_2$, a third clock signal $\Phi_3$ enter fourth clock signal $\Phi_4$. Clock signal generating circuit 130 is connected to a power supply potential node 110 supplied with a power supply potential $V_{CC}$, and to a ground potential node 120 at a ground potential. Clock signal generating circuit 130 thus provides the four clock signals $\Phi_1$, $\Phi_2$, $\Phi_3$ and $\Phi_4$.

Oscillating circuit 131 includes an odd number of inverters 131a connected in series, the output terminal of the last inverter 131a being connected to the input terminal of the first inverter 131a.

Figure 2:
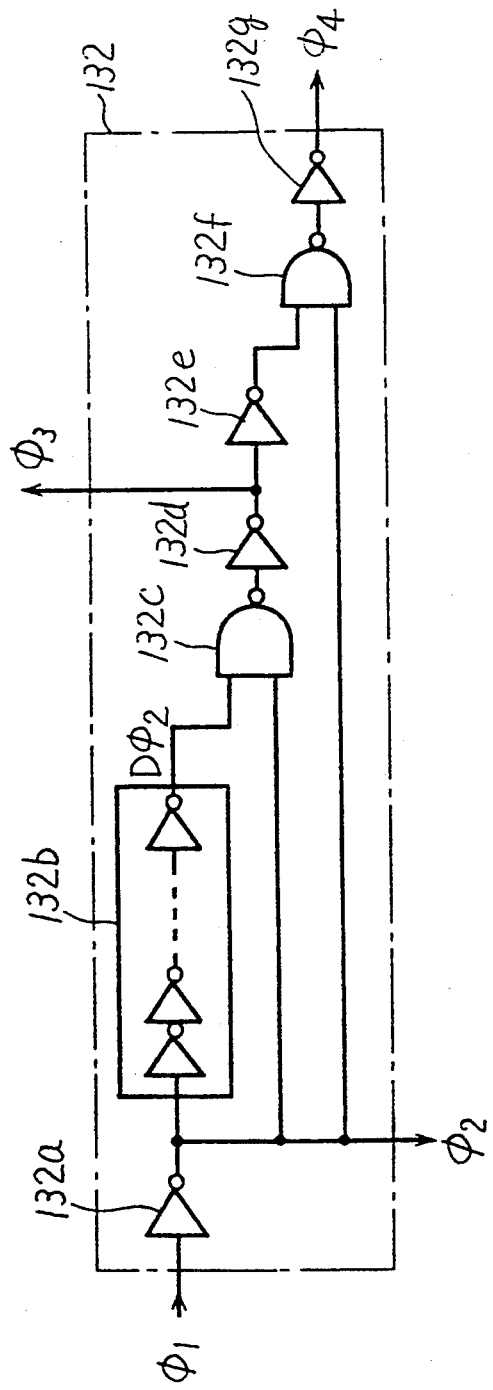
FIG. 2 is a schematic diagram showing the clock waveform changing circuit in the substrate potential generating circuit shown in FIG. 1.

Clock waveform changing circuit 132 includes, as shown in FIG. 2, an inverter 132a, a delay circuit 132b, an NAND gate 132c, an inverter 132d, an inverter 132e, an NAND gate 132f and an inverter 132g.

Inverter 132a receives the first clock signal $\Phi_1$ from oscillating circuit 131 to provide the second clock signal $\Phi_2$ which is the inverted signal of the signal $\Phi_1$. Delay circuit 132b including an even number of inverters connected in series receives the second clock signal $\Phi_2$ from inverter 132a to delay the same and provide the delayed signal D$\Phi_2$. NAND gate 132c receives the delayed signal D$\Phi_2$ from delay circuit 132b and the second clock signal $\Phi_2$ from inverter 132a. Inverter 132d receives an output signal from NAND gate 132c to provide the third clock signal $\Phi_3$. Inverter 132e receives the third clock signal $\Phi_3$ from inverter 132d to provide the inverted signal thereof. NAND gate 132f receives the output signal from inverted 132e and the second clock signal $\Phi_2$ from inverter 132a. Inverter 132g receives an output signal from NAND gate 132f to provide the fourth clock signal $\Phi_4$.

Second charge pump circuit 140 includes a first sub-charge pump circuit 141 and a second sub-charge pump circuit 142.

First sub-charge pump circuit 141 includes an inverter 141a, a capacitor 141c, a capacitor 141e, a p-channel MOS transistor 141f, a p-channel MOS transistor 141g, and a p-channel MOS transistor 141h.

Inverter 141a receives the fourth clock signal $\Phi_4$ from clock signal generating circuit 130. One electrode of capacitor 141c receives an output signal from inverter 141a and the other electrode is connected to a third node 141b. One electrode of capacitor 141e receives the fourth clock signal $\Phi_4$, and the other electrode thereof is connected to a fourth node 141d. p-channel MOS transistor 141f is connected between fourth node 141d and ground potential node 120, and has its gate electrode connected to ground potential node 120. p-channel MOS transistor 141g is connected between third node 141b and ground potential node 120, and has its gate electrode connected to fourth node 141d. p-channel MOS transistor 141h is connected between third node 141b and a second output node 160, and has its gate electrode connected to third node 141b.

First sub-charge pump circuit 1-41 thus receives the fourth clock signal $\Phi_4$ from clock signal generating circuit 130, and reduces a potential $N_2$ of second node 160, thereby providing a specific potential (a third potential).

Second sub-charge pump circuit 142 includes an inverter 142a, a capacitor 142b, a capacitor 142d, a p-channel MOS transistor 142e, and a p-channel MOS transistor 142f.

Inverter 142a receives the third clock signal $\Phi_3$ from clock signal generating circuit 130. One electrode of capacitor 142b receives an output signal from inverter 142a, and the other electrode thereof is connected to second node 160. One electrode of capacitor 142d receives the second clock signal $\Phi_2$ from clock signal generating circuit 130, and the other electrode thereof is connected to a fifth node 142c. p-channel MOS transistor 142e is connected between fifth node 142c and ground potential node 120, and has its gate electrode connected to ground potential 120. p-channel MOS transistor 142f is connected between second node 160 and ground potential node 120, and has its gate electrode connected to fifth node 142c.

Second sub-charge pump circuit 142 thus receives the second and third clock signals $\Phi_2$ and $\Phi_3$ from clock signal generating circuit 130, and reduces the potential $N_2$ of second node 160 to be lower than the potential provided from the first sub-charge pump (the third potential), thereby providing a specific potential (a second potential).

First charge pump circuit 143 includes an inverter 143a, a capacitor 143b, an inverter 143c, a capacitor 143e, a p-channel MOS transistor 143f, and p-channel MOS transistors 143g and 143h.

Inverter 143a receives the third clock signal $\Phi_3$ from clock signal generating circuit 130. One electrode of capacitor 143b receives an output signal from inverter 143a, and the other electrode thereof is connected to a first node 143j. Inverter 143c receives the first clock signal $\Phi_1$ from clock signal generating circuit 130. One electrode of capacitor 143e receives an output signal from inverter 143c, and the other electrode thereof is connected to a sixth node 143d.

p-channel MOS transistor 143f is connected between sixth node 143d and ground potential node 120, and has its gate electrode connected to ground potential node 120. p-channel MOS transistor 143g is connected between first node 143j and ground potential node 120, and has its gate electrode connected to sixth node 143d. p-channel MOS transistor 143h is connected between first node 143j and the semiconductor substrate, and has its gate electrode connected to second node 160.

First charge pump circuit 143 thus receives the first and third clock signals $\Phi_1$ and $\Phi_3$ from clock signal generating circuit 130 to reduce a potential $N_1$ of first node 143j.

Figure 3:
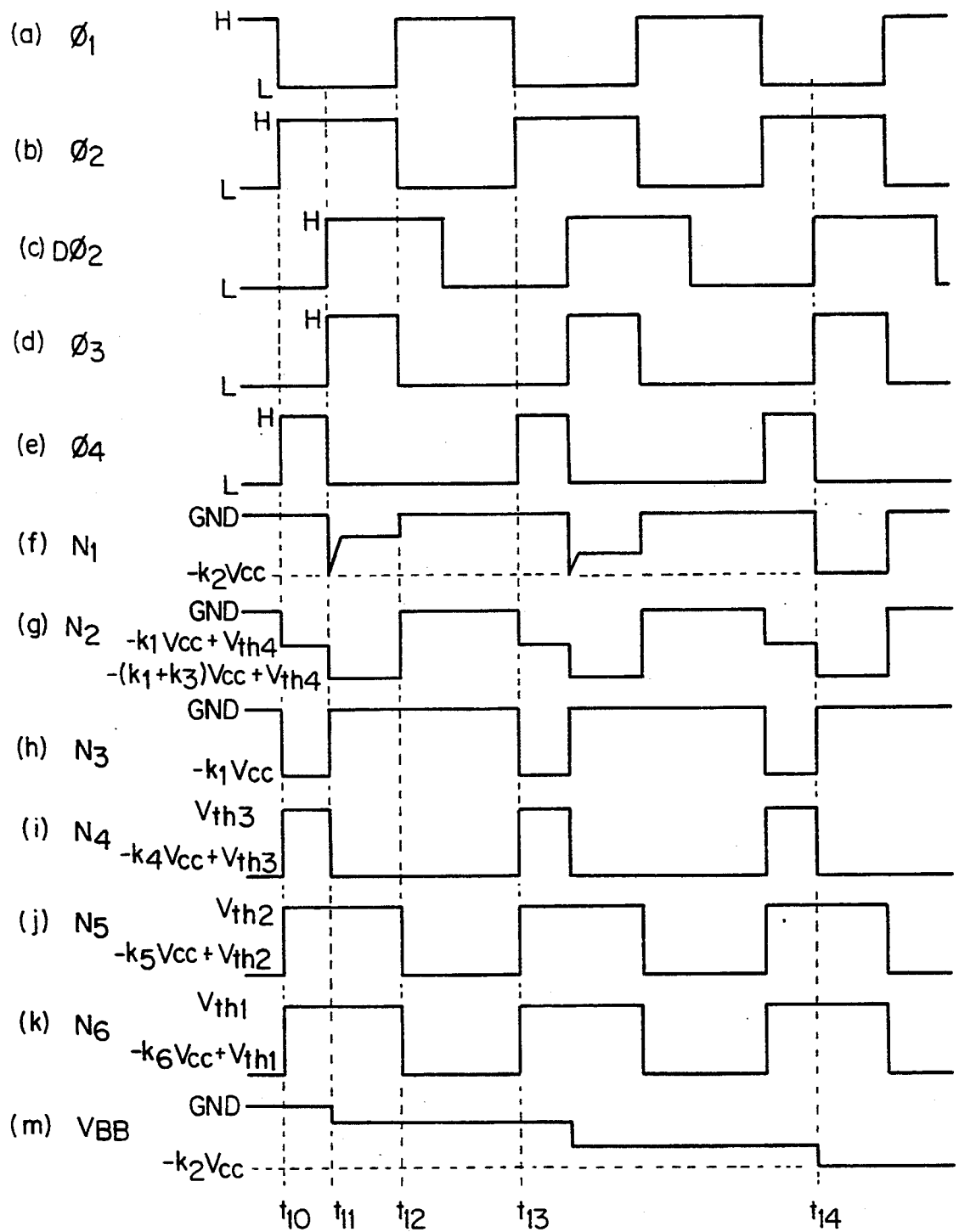
FIG. 3 is a timing chart showing the operation of the substrate potential generating circuit shown in FIG. 1.

The operation of the substrate potential generating circuit will hereinafter be described in detail with reference to the timing chart of FIG. 3.

First, as shown in FIG. 3(a), oscillating circuit 131 in clock signal generating circuit 130 provides the first clock signal $\Phi_1$. Inverter 132a in clock waveform changing circuit 132 receives the first clock signal $\Phi_1$ to provide the second clock signal $\Phi_2$ which is the inverted signal of the signal $\Phi_1$, as shown in FIG. 3(b). Delay circuit 132b receives the second clock signal $\Phi_2$ to delay the same and provide the delayed signal D$\Phi_2$, as shown in FIG. 3(c). NAND gate 132c receives the second clock signal $\Phi_2$ and the delayed signal D$\Phi_2$ and provides a signal at an L level only when both of the two signals attain an H level. Inverter 132d, as shown in FIG. 3(d), inverts the output signal from NAND gate 132c to provide the third clock signal $\Phi_3$.

Inverter 132e provides the inverted signal of the third clock signal $\Phi_3$. NAND gate 132f receives the inverted signal from inverter 132e and the second clock signal $\Phi_2$, and provides a signal at an L level only when both of the two signals attain an H level. Inverter 132g, as shown in FIG. 3(e), inverts the output signal from NAND gate 132f to provide the fourth clock signal $\Phi_4$.

At a timing $t_{10}$ when the first clock signal $\Phi_1$ falls from an H level to an L level, the substrate potential $V_{BB}$ of the semiconductor substrate is assumed to be a ground potential, as shown in FIG. 3(m).

When the first clock signal $\Phi_1$ falls from an H level to an L level at the timing $t_{10}$, as shown in FIG. 3(a), the second clock signal $\Phi_2$ rises from an L level to an H level, as shown in FIG. 3(b). The third clock signal $\Phi_3$ is held at an L level, as shown in FIG. 3(d), and the fourth clock signal $\Phi_4$ rises from an L level to an H level, as shown in FIG. 3(e).

When the first clock signal $\Phi_1$ falling from an H level to an L level is applied to inverter 143c at the timing $t_{10}$, the inverted signal thereof is applied to capacitor 143e by inverter 143c. Accordingly, a potential $N_6$ of sixth node 143d rises by capacitive coupling of capacitor 143e, as shown in FIG. 3(k). When the potential $N_6$ exceeds an absolute value $V_{th1}$ of the threshold voltage of p-channel MOS transistor 143f connected between sixth node 143d and ground potential node 120, p-channel MOS transistor 143f is rendered conductive. This allows conduction between sixth node 143d and ground potential node 120, whereby the potential $N_6$ of six node 143d is the absolute value $V_{th1}$ of the threshold voltage of p-channel MOS transistor 143f, so that p-channel MOS transistor 143g whose gate receives the potential $N_6$ is rendered non-conductive.

The second clock signal $\Phi_2$ rising from an L level to an H level is applied to capacitor 142d in second subcharge pump circuit 142 at the timing $t_{10}$. A potential $N_5$ of fifth node 142c rises by capacitive coupling of capacitor 142d, as shown in FIG. 3(j). When the potential $N_5$ exceeds an absolute value $V_{th2}$ of the threshold voltage of p-channel MOS transistor 142e connected between fifth node 142c and ground potential node 120, p-channel MOS transistor 142e is rendered conductive. This allows conduction between fifth node 142c and ground potential node 120, whereby the potential $N_5$ of fifth node 142c is the absolute value $V_{th2}$ of the threshold voltage of p-channel MOS transistor 142e, so that p-channel MOS transistor 142f whose gate receives the potential $N_5$ is rendered non-conductive.

At the timing $t_{10}$, the fourth clock signal $\Phi_4$ rising from an L level to an H level is applied to capacitor 141e in first gate potential generating circuit 141. A potential $N_4$ of fourth node 141d rises by capacitive coupling of capacitor 141e, as shown in FIG. 3(i). When the potential $N_4$ exceeds an absolute value $V_{th3}$ of the threshold voltage of p-channel MOS transistor 141f connected between fourth node 141d and ground potential node 120, p-channel MOS transistor 141f is rendered conductive. This allows conduction between fourth node 141d and ground potential node 120, whereby the potential $N_4$ of fourth node 141d is the absolute value $V_{th3}$ of the threshold voltage of p-channel MOS transistor 141f, so that the p-channel MOS transistor 141g whose gate receives the potential $N_4$ is rendered non-conductive.

The fourth clock signal $\Phi_4$ is applied to inverter 141a to provide the inverted signal thereof to capacitor 141c. A potential $N_3$ of third node 141b drops to $-k_1 V_{CC}$, as shown in FIG. 3(h), by capacitive coupling of capacitor 141c, rendering p-channel MOS transistor 141h conductive. This allows conduction between second node 160 and third node 141b, whereby the potential $N_2$ of second node 160 drops, as shown in FIG. 3(g). When the potential $N_2$ attains a potential higher than the potential $-k_1 V_{CC}$ of third node 141b by an absolute value $V_{th4}$ of the threshold voltage of p-channel MOS transistor 141h, that is, a potential $-k_1 V_{CC} V_{th4}$ (the third potential), p-channel MOS transistor 141h is rendered non-conductive. Since an absolute value $V_{th5}$ of the threshold voltage of p-channel MOS transistor 143h whose gate receives the potential $N_2$ of second node 160 is set larger than the absolute value $|-k_1 V_{CC}+V_{th4}|$ of the third potential, p-channel MOS transistor 143h is in the non-conductive state.

Thereafter, at a timing $t_{11}$, the third clock signal $\Phi_3$ from clock signal generating circuit 130 rises from an L level to an H level, as shown in FIG. 3(d), and the fourth signal $\Phi_4$ falls from an H level to an L level, as shown in FIG. 3(e). The inverted signal of the third clock signal $\Phi_3$ is applied to capacitor 143e by inverter 143a. Therefore, the potential $N_1$ of first node 143j drops to $-k_2 V_{CC}$ (the first potential), as shown in FIG. 3(f), by capacitive coupling of capacitor 143b.

The inverted signal of the third clock signal $\Phi_3$ is applied to capacitor 142b by inverter 142a in second sub-charge pump circuit 142. The potential $N_2$ of second node 160 drops from $-k_1 V_{CC}+V_{th4}$ (the third potential) to $-(k_1+k_3) V_{CC}+V_{th4}$ (the second potential), as shown in FIG. 3(g), by capacitive coupling of capacitor 142b. Since the potential $N_2$ decreases to be lower than a potential $(-k_2 V_{CC}-V_{th5})$ obtained by subtraction of the absolute value $V_{th5}$ of the threshold voltage of p-channel MOS transistor 143h from the first potential $-k_2 V_{CC}$, p-channel MOS transistor 143h is rendered conductive. Specifically, the absolute value $V_{th5}$ of the threshold voltage of p-channel MOS transistor 143h is set so as to satisfy the following.

$$V_{th5} < (k_1-k_2+k_5)V_{CC} - V_{th4}$$

This allows conduction between the semiconductor substrate and first node 143j, whereby charges moved from the semiconductor substrate to first node 143j. The substrate potential $V_{BB}$ of the semiconductor substrate slightly drops because of the large capacity of the substrate, as shown in FIG. 3(m), while the potential $N_1$ of first node 143j greatly rises compared to the dropping manner of $V_{BB}$, because of the small capacity of the node, as shown in FIG. 3(f). Consequently, the substrate potential $V_{BB}$ and the potential $N_1$ of first node 143j attain an identical potential.

When the fourth clock signal $\Phi_4$ falling from an H level to an L level is applied to capacitor 141e in first sub-charge pump circuit 141 at the timing $t_{11}$, the potential $N_4$ of fourth node 141d drops to $(-k_1 V_{CC}+V_{th3})$, as shown in FIG. 3(i), by capacitive coupling of capacitor 141e. As a result, p-channel MOS transistor 141f is rendered non-conductive, and p-channel MOS transistor 141g whose gate receives the potential $N_4$ is rendered conductive. This allows conduction between ground potential node 120 and third node 141b, whereby the potential $N_3$ of third node 141b attains a ground potential, as shown in FIG. 3(h).

Thereafter, when the first clock signal $\Phi_1$ from clock signal generating circuit 130 rises from an L level to an H level at a timing $t_{12}$, as shown in FIG. 3(a), the second clock signal $\Phi_2$ falls from an H level to an L level, as shown in FIG. 3(b), the third clock signal $\Phi_3$ falls from an H level to an L level, as shown in FIG. 3(d), and the fourth clock signal $\Phi_4$ is held at an L level, as shown in FIG. 3(e).

At the timing $t_{12}$, the second clock signal $\Phi_2$ falling from an H level to an L level is applied to capacitor 142d in second sub-charge pump circuit 142, and the potential $N_5$ of fifth node 142c drops from $V_{th2}$ to $(-k_5 V_{CC}+V_{th2})$, as shown in FIG. 3(j), by capacitive coupling of capacitor 142d. As a result, p-channel MOS transistor 142e is rendered non-conductive, and p-channel MOS transistor 142f whose gate receives the potential $N_5$ is rendered conductive. This allows conduction between ground potential node 120 and second node 160, whereby the potential $N_2$ of second node 160 attains a ground potential, as shown in FIG. 3(g). p-channel MOS transistor 143h whose gate receives the potential $N_2$ is rendered non-conductive.

When the first clock signal $\Phi_1$ rising from an L level to an H level is applied to inverter 143c in first charge pump circuit 143 at the timing $t_{12}$, the inverted signal thereof is applied to capacitor 143e. The potential $N_6$ of sixth node 143d drops from $V_{th1}$ to $(-k_6 V_{CC}+V_{th1})$, as shown in FIG. 3(k), by capacitive coupling of capacitor 143e. As a result, p-channel MOS transistor 143f is rendered non-conductive, and p-channel MOS transistor 143g whose gate receives the potential $N_6$ is rendered conductive. This allows conduction between ground potential node 120 and first node 143j, whereby the potential $N_1$ of first node 143j attains a ground potential, as shown in FIG. 3(f).

At a timing $t_{13}$, the first clock signal $\Phi_1$ from clock signal generating circuit 130 falls from an H level to an L level again. After the timing $t_{13}$, the above-described operation from the timing $t_{10}$ to the timing $t_{13}$ is repeated. Consequently, as shown in FIG. 3(m), the substrate potential $V_{BB}$ gradually drops, and finally attains $-k_2 V_{CC}$ at a timing $t_{14}$.

As can be seen from the above detailed description, in the substrate potential generating circuit according to the first embodiment, the potential $N_2$ of the gate electrode of p-channel MOS transistor 143h connected between the semiconductor substrate and first node 143j is made to be lower than the potential $-k_2 V_{CC}$ at the time of the potential $N_1$ of first node 143j being decreased, by the absolute value $V_{th5}$ of the threshold voltage of p-channel MOS transistor 143h, whereby the substrate potential $V_{BB}$ can be decreased to $-k_2 V_{CC}$.

Moreover, a potential difference $\{(1+k_1+k_3) V_{CC}-V_{th4}\}$ is applied to a pn-junction between the source electrode of p-channel MOS transistor 141h connected to second node 160 and the N-well. A potential difference $(1+k_2) V_{CC}$ is applied to a pn-junction between the source electrode of p-channel MOS transistor 143h connected to the semiconductor substrate and the N-well. Specifically, applied is a potential difference which is larger than the potential difference applied to the pn-junction between the source electrode of p-channel MOS transistor 47 connected to the semiconductor substrate and the N-well in the conventional substrate potential generating circuit shown in FIG. 9.

In the substrate potential generating circuit according to the first embodiment, therefore, the substrate potential $V_{BB}$ can be made lower than that obtained in the conventional one by the absolute value $V_{th5}$ of the threshold voltage of p-channel MOS transistor 143h. Accordingly, even if the substrate potential generating circuit of the first embodiment is supplied with the lower power supply potential $V_{CC}$, the same substrate potential $V_{BB}$ as the substrate potential obtained in the conventional substrate potential generating circuit can be obtained, and the potential difference applied to the pn-junction can be reduced.

For example, the case is considered that the substrate potential $V_{BB}$ of approximately $-3V$ is to be obtained where the coupling efficiency k is approximately 1 and the threshold voltage of the MOS transistor is 1.7V on the gate width of 0.5 $\mu$m. Since the substrate potential $V_{BB}$ will drop to $(-kV_{CC}+V_{th2})$ according to the conventional case shown in FIG. 9, the power supply potential $V_{CC}$ of 5V will allow the substrate potential $V_{BB}$ of $-3.3V$. According to the first embodiment, on the other hand, the power supply potential $V_{CC}$ of 3.3V will allow the substrate potential $V_{BB}$ of $-3.3V$.

Therefore, according to the conventional case, the potential difference $\{(1+k) V_{CC}-V_{th2}\}$ applied to the pn-junction will be 8.3V $\{=(1+1)\cdot 5-1.7\}$, whereas, according to the first embodiment, the potential difference $\{(1+k_1+k_3) V_{CC}-V_{th4}\}$ will be 8.2V $\{=(1+1+1)\cdot 3.3-1.7\}$, the other potential difference $(1+k_2) V_{CC}$ being 6.6V $\{=(1+1)\cdot 3.3\}$. The potential difference applied to the pn-junction can thus be reduced compared to that in the conventional case.

Where the substrate potential $V_{BB}$ of $-1.5V$ is required, the power supply potential $V_{CC}$ of 3.3V will allow the substrate potential $V_{BB}$ of $-1.6V$ in the conventional case, whereas the power supply potential $V_{CC}$ of 3.3V will allow the substrate potential $V_{BB}$ of $-3.3V$ in the first embodiment. Accordingly, since the conventional circuit operates almost at the limit of its capability, it takes long to attain the target substrate potential $V_{BB}$ of $-1.5V$. On the other hand, since the substrate potential generating circuit in the first embodiment has enough capability of obtaining the target substrate potential $V_{BB}$ ($-1.5V$), the target substrate potential $V_{BB}$ of $-1.5V$ can be rapidly attained by stopping the operation of the circuit with a detector or the like.

Assuming that the coupling efficiency k is approximately 1 in general, the potential $N_1$ of the drain electrode of p-channel MOS transistor 143h will be reduced to $-V_{CC}$. Also in this state, the potential $N_2$ of $-V_{CC}-V_{th5}$ of the gate electrode is required for turning on p-channel MOS transistor 143h. Usually, a potential lower than the potential of the opposite polarity $-V_{CC}$ of the power supply potential $V_{CC}$ cannot be obtained only by a single charge pump circuit.

For the above-described reasons, second charge pump circuit 140 includes two charge pump circuits 141 and 142 in the first embodiment. This structure allows the potential $N_2$ not more than $-V_{CC}-V_{th5}$ of the gate electrode of p-channel MOS transistor 143h through two steps. Specifically, according to the first embodiment, the present invention can be implemented simply by supply of a single power supply potential.

SECOND EMBODIMENT

In the substrate potential generating circuit in accordance with the first embodiment, the potential $N_1$ of first node 143j is a ground potential, and the potential $N_2$ of second node 160 is $(-k_1 V_{CC}+V_{th4})$ between the timings $t_{10}$ and $t_{11}$. Accordingly, where the absolute value $V_{th5}$ of the threshold voltage of p-channel MOS transistor 143h in switching element 170 is set to a small value, p-channel MOS transistor 143h is in the conductive state, so that charges of first node 143j flow back to the semiconductor substrate, lowering efficiency for drawing off charges. Therefore, the absolute value $V_{th5}$ of the threshold voltage is required to set to a large value so that p-channel MOS transistor 143h should not be turned on when the potential $N_2$ is $(-k_1 V_{CC}+V_{th4})$.

Figure 4:
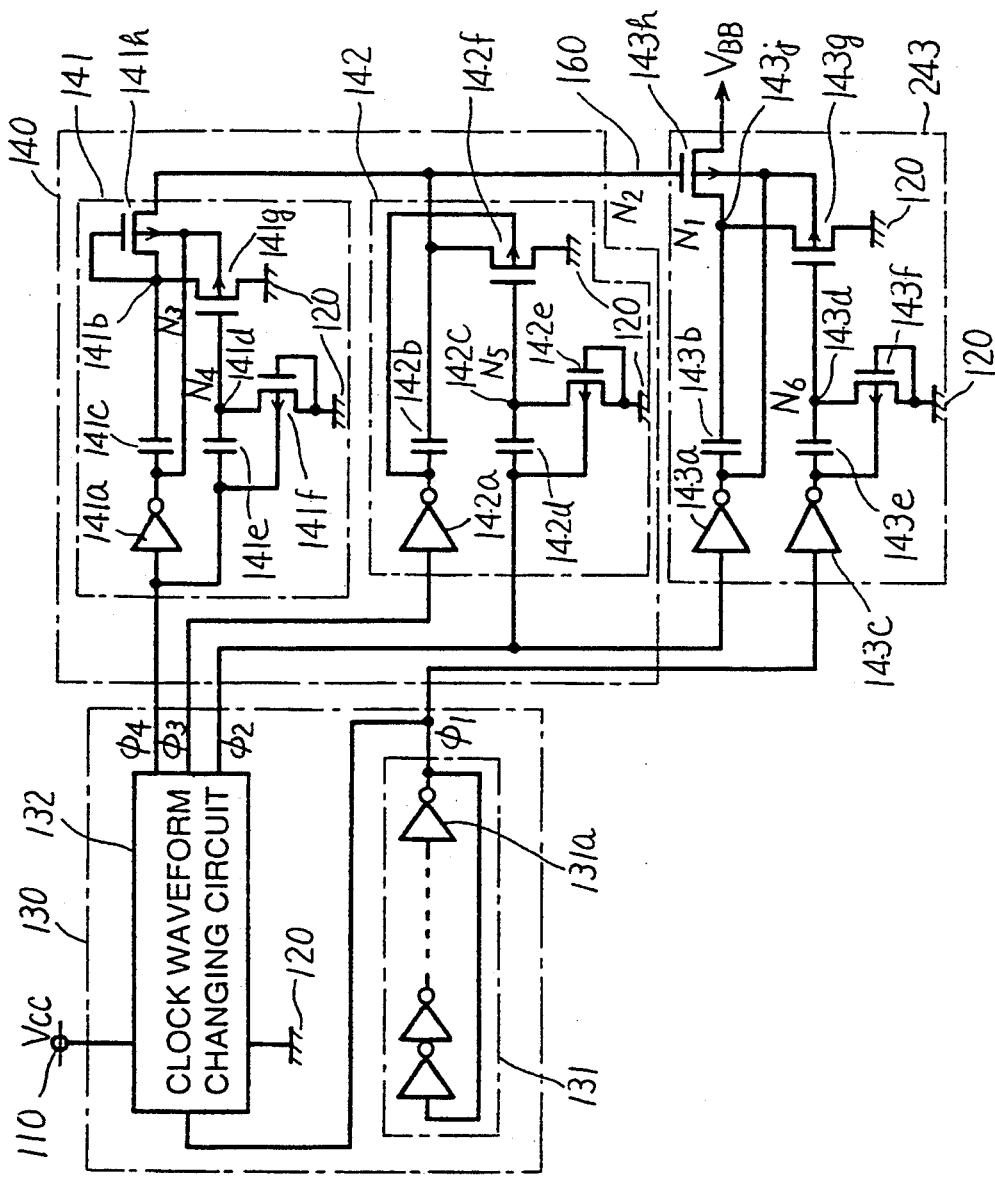
FIG. 4 is a schematic diagram showing the entire structure of a substrate potential generating circuit in accordance with the second embodiment of the present invention.

FIG. 4 is a schematic diagram showing the entire structure of a substrate potential generating circuit in accordance with a second embodiment of the present invention. Referring to FIG. 4, the substrate potential generating circuit includes a clock signal generating circuit 130, a first charge pump circuit 243 and a second charge pump circuit 140.

Second charge pump circuit 140 includes a first sub-charge pump circuit 141 and a second sub-charge pump circuit 142, as in the first embodiment. First charge pump circuit 243 receives a first clock signal $\Phi_1$ and a second clock signal $\Phi_2$ from clock signal generating circuit 130 to lower a potential $N_1$ of a first node 143j. In FIG. 4, portions denoted by the same characters of as in FIG. 1 are the same or corresponding parts. The difference of the second embodiment from the first embodiment is that the second clock signal $\Phi_2$ is applied to an inverter 143a in first charge pump circuit 243 in place of the third clock signal $\Phi_3$.

Figure 5:
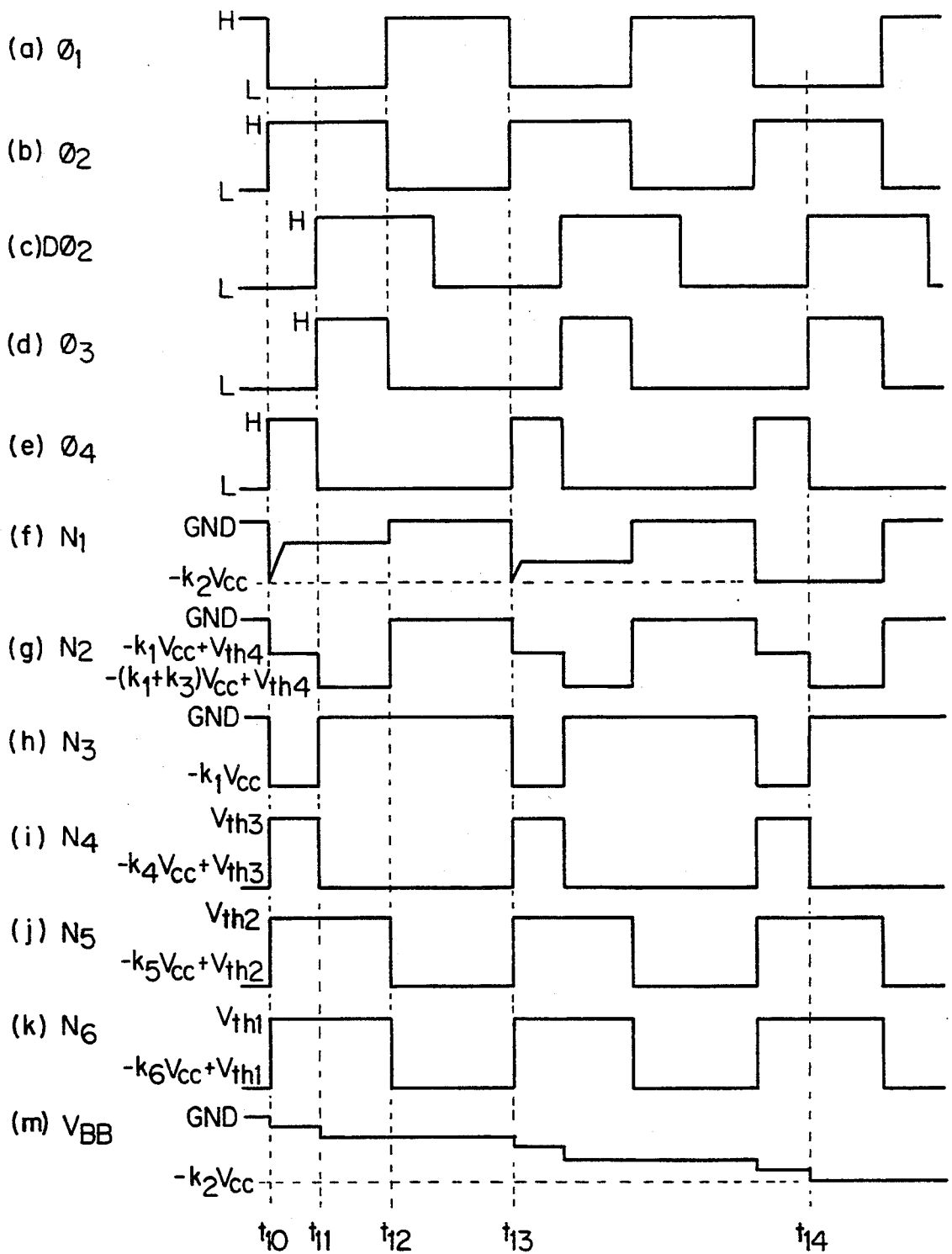
FIG. 5 is a timing chart showing the operation of the substrate potential generating circuit shown in FIG. 4.

The operation of the substrate potential generating circuit in accordance with the second embodiment will hereinafter be described in detail with reference to the timing chart of FIG. 5.

As in the first embodiment, first to fourth clock signals $\Phi_1$-$\Phi_4$ are provided from clock signal generating circuit 130, as shown in FIGS. 5(a), (b), (d), and (e).

The difference of the operation in the second embodiment from that in the first embodiment is that the second clock signal $\Phi_2$ rising from an L level to an H level at a timing $t_{10}$ is applied to inverter 143a in first charge pump circuit 243, and the inverted signal thereof is applied to a capacitor 143b. This reduces a potential $N_1$ of first node 143j to $-k_1 V_{CC}$ (a first potential), as shown in FIG. 5(f), by capacitive coupling of capacitor 143b. Since a potential $N_2$ of second node 160 drops to $-k_1 V_{CC}+V_{th4}$ (a third potential), p-channel MOS transistor 143h whose gate receives the potential $N_2$ is rendered conductive. This allows conduction between the semiconductor substrate and first node 143j, whereby charges move from the semiconductor substrate to first node 143j. A substrate potential $V_{BB}$ of the semiconductor substrate slightly drops because of the large capacity of the substrate, as shown in FIG. 5(m). The potential $N_1$ of first node 143j greatly rises because of the small capacity of the node, as shown in FIG. 5(f). Consequently, the substrate potential $V_{BB}$ and the potential $N_1$ of first node 143j attain an identical potential.

Thereafter, when the third clock signal $\Phi_3$ rising from an L level to an H level is applied to an inverter 142a in second sub-charge pump circuit 142 at a timing $t_{11}$, the inverted signal thereof is applied to capacitor 142b. This reduces the potential $N_2$ of second node 160 from $-k_1 V_{CC}+V_{th4}$ (the third potential) to $-(k_1+k_3) V_{CC}+V_{th4}$ (a second potential), as shown in FIG. 5(g), by capacitive coupling of capacitor 142b.

In the substrate potential generating circuit in accordance with the second embodiment, back flow of charges from the semiconductor substrate to first node 143j is prevented, whereby the substrate potential $V_{BB}$ can be rapidly reduced to $-k_1 V_{CC}$ by effectively drawing off charges of the semiconductor substrate.

As described above, according to the second embodiment, the substrate potential $V_{BB}$ of the deeper level can be obtained as in the first embodiment, allowing wider selection of the substrate potential $V_{BB}$. In addition, unless a required substrate potential is close to the limit of the capability of the substrate potential generating circuit, the substrate potential $V_{BB}$ can rapidly attain the required potential. Also in the case of a low power supply potential, the substrate potential $V_{BB}$ of the same degree as in the conventional substrate potential generating circuit can be obtained. Furthermore, the present invention can be implemented simply by supplying a single power supply potential, as in the first embodiment.

THIRD EMBODIMENT

Figure 6:
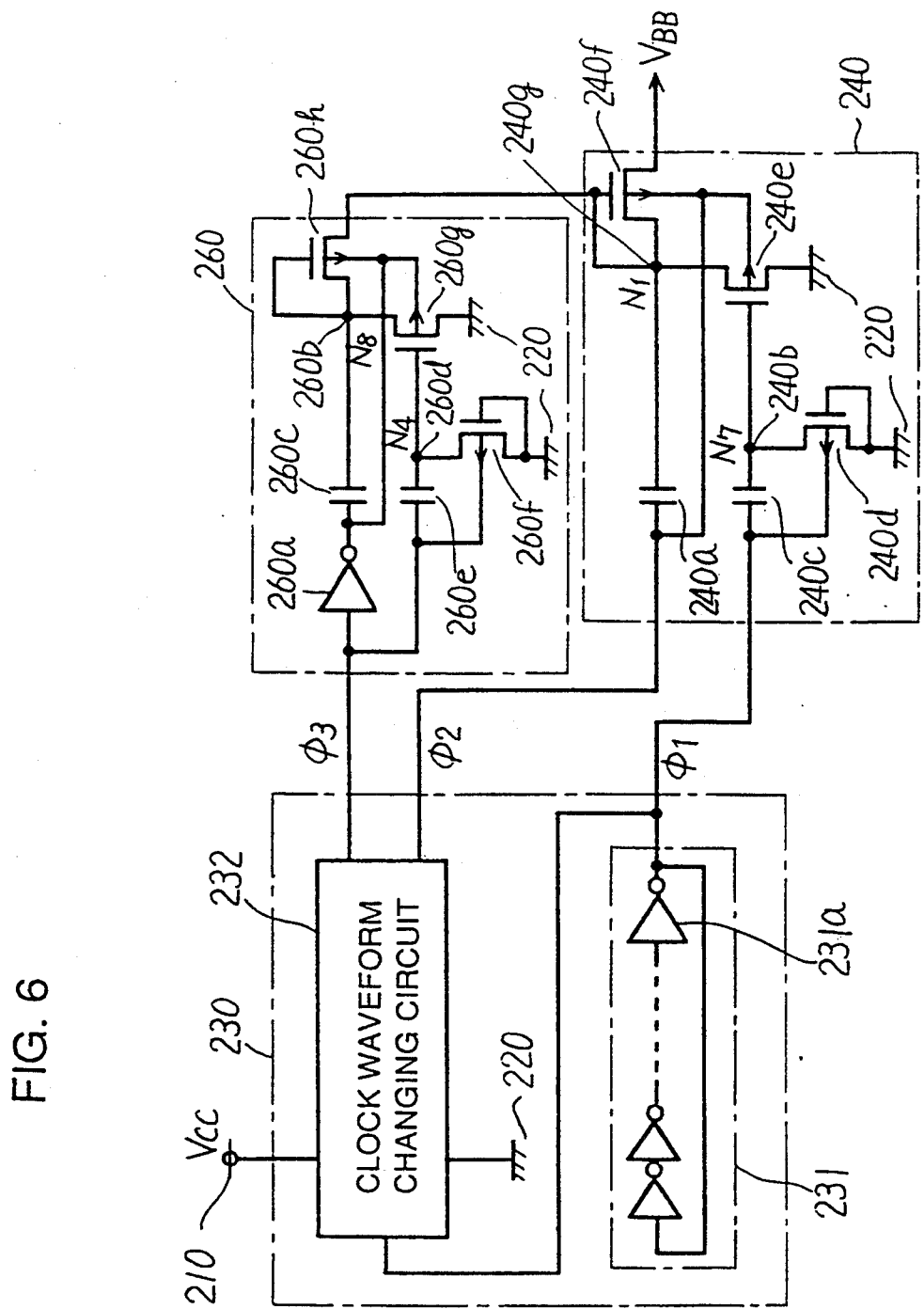
FIG. 6 is a schematic diagram showing the entire structure of a substrate potential generating circuit in accordance with a third embodiment of the present invention.

FIG. 6 is a schematic diagram showing the entire structure of a substrate potential generating circuit in accordance with a third embodiment of the present invention.

Referring to FIG. 6, the substrate potential generating circuit includes a clock signal generating circuit 230, a first charge pump circuit 240 and a second charge pump circuit 260. Circuits 230, 240 and 260 are connected to a power supply potential node 210 supplied with a power supply potential $V_{CC}$, and to a ground potential node 220 at a ground potential.

Clock signal generating circuit 230 includes an oscillating circuit 231 and a clock waveform changing circuit 232. Oscillating circuit 231, which is a ring oscillator including an odd number of inverters 231a connected in series, provides a first clock signal $\Phi_1$.

Figure 7:
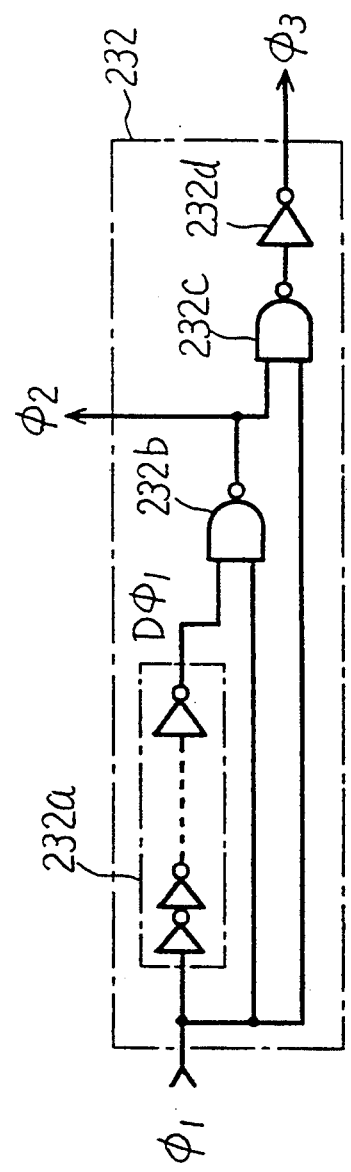
FIG. 7 is a schematic diagram showing the clock waveform changing circuit in the substrate potential generating circuit shown in FIG. 6.

Referring to FIG. 7, clock waveform changing circuit 232 includes a delay circuit 232a, an NAND gate 232b, an NAND gate 232c and an inverter 232d. Delay circuit 232a including a plurality of inverters connected in series receives the first clock signal $\Phi_1$ from oscillating circuit 231 to delay the same and provide the delayed signal $D\Phi_1$. NAND gate 232b receives the delayed signal $D\Phi_1$ and the first clock signal $\Phi_1$, and provides a second clock signal $\Phi_2$ at an L level only when both of the two signals are at an H level. NAND gate 232c receives the second clock signal $\Phi_2$ from NAND gate 232b and the first clock signal $\Phi_1$. Inverter 232d receives an output signal from NAND gate 232c to provide a third clock signal $\Phi_3$ obtained by inversion of the received signal. Clock waveform changing circuit 232 thus receives the first clock signal $\Phi_1$ from oscillating circuit 231 to provide the second clock signal $\Phi_2$ and the third clock signal $\Phi_3$.

First charge pump circuit 240 includes a capacitor 240a, a capacitor 240c, a p-channel MOS transistor 240d, a p-channel MOS transistor 240e, and a p-channel MOS transistor 240f.

One electrode of capacitor 240a receives the second clock signal $\Phi_2$), and the other electrode is connected to a first node 240g. One electrode of capacitor 240c receives the first clock signal $\Phi_1$, and the other electrode thereof is connected to a seventh node 240b. p-channel MOS transistor 240d is connected between seventh node 240n and ground potential node 220, and has its gate electrode connected to ground potential node 220. p-channel MOS transistor 240e is connected between first node 240g and ground potential node 220, and has its gate electrode connected to seventh node 240b.

p-channel MOS transistor 240f is connected between first node 240g and the semiconductor substrate, and has its gate electrode connected to first node 240g.

First charge pump circuit 240 thus receives the first clock signal $\Phi_1$ and the second clock signal $\Phi_2$ from clock signal generating circuit 230, and decreases a potential $N_1$ of first node 240g from a prescribed potential (a first potential) applied from the second charge pump circuit described later to another prescribed potential (a second potential) when the second clock signal $\Phi_2$ falls from an H level to an L level.

Second charge pump circuit 260 includes an inverter 260a, a capacitor 260c, a p-channel MOS transistor 260f, a p-channel MOS transistor 260g and a p-channel MOS transistor 260h.

Inverter 260a receives a third clock signal $\Phi_3$ to provide the inverted signal thereof. One electrode of capacitor 260c receives the inverted signal from inverter 260a, and the other electrode thereof is connected to an eighth node 260b. One electrode of capacitor 260e receives the third clock signal $\Phi_3$, and the other electrode thereof is connected to a ninth node 260d.

p-channel MOS transistor 260f is connected between ninth node 260d and ground potential node 220, and has its gate electrode connected to ground potential node 220. p-channel MOS transistor 260g is connected between eighth node 260b and ground potential node 220, and has its gate electrode connected to ninth node 260d.

p-channel MOS transistor 260h is connected between eighth node 260b and first node 240g, and has its gate electrode connected to eighth node 260b.

Second charge pump circuit 260 thus receives the third clock signal $\Phi_3$ from clock signal generating circuit 230, and decreases the potential $N_1$ of first node 240g to the prescribed potential (the first potential) when the third clock signal $\Phi_3$ rises from an L level to H level.

Figure 8:
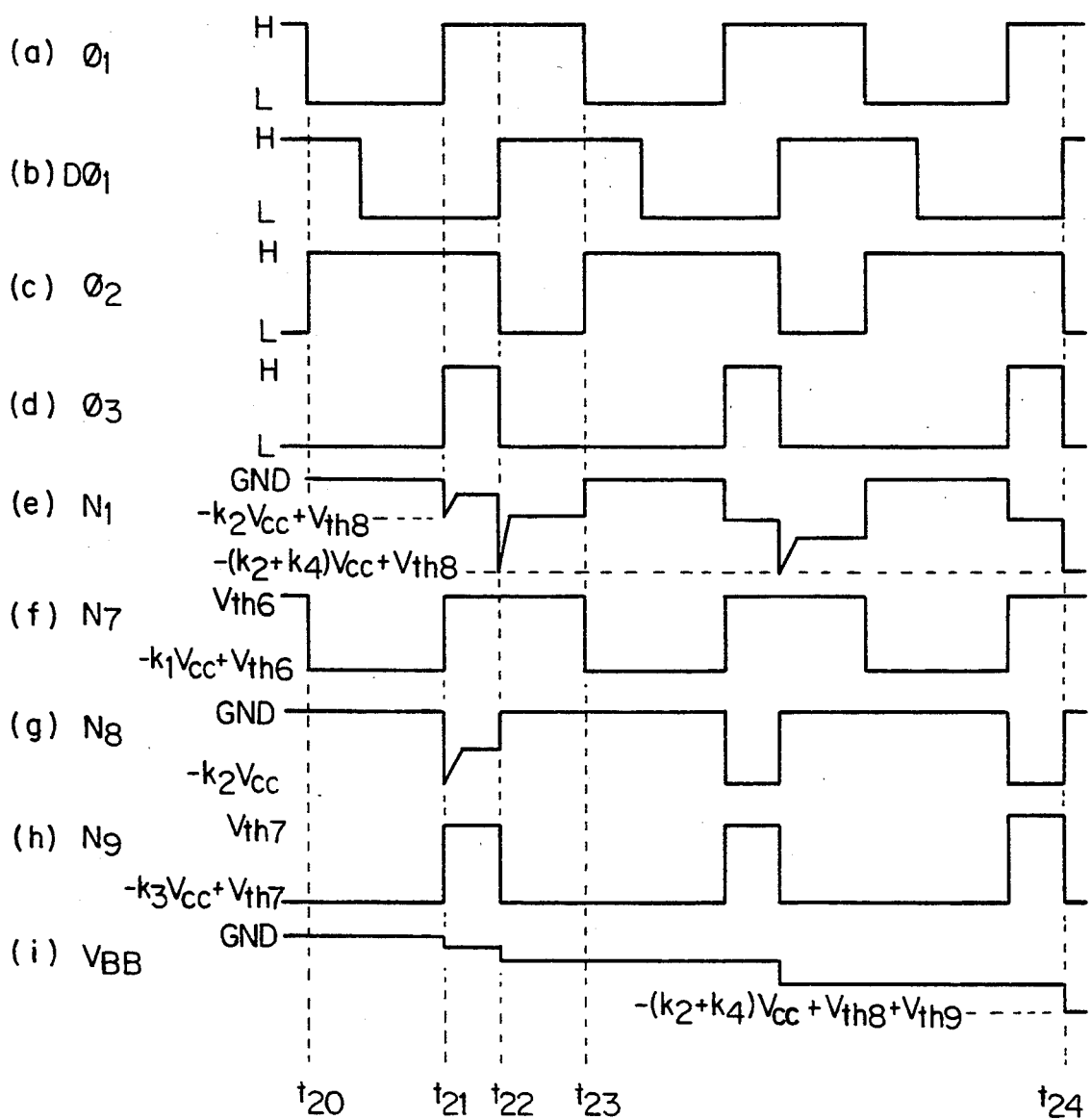
FIG. 8 is a timing chart showing the operation of the substrate potential generating circuit shown in FIG. 6.

The operation of the substrate potential generating circuit in accordance with the third embodiment will hereinafter be described in detail with reference to the timing chart of FIG. 8.

As shown in FIG. 8(a), oscillating circuit 231 in clock signal generating circuit 230 generates the first clock signal $\Phi_1$ to provide the same to delay circuit 232a in clock waveform changing circuit 232. Subsequently, delay circuit 232a delays the first clock signal $\Phi_1$ to provide the delayed signal $D\Phi_1$, as shown in FIG. 8(b). NAND gate 232b receives the delayed signal $D\Phi_1$ and the first clock signal $\Phi_1$, and provides the second clock signal $\Phi_2$ at an L level only when both of the two signals attain an H level, as shown in FIG. 8(c). NAND gate 232c receives the second clock signal $\Phi_2$ and the first clock signal $\Phi_1$, and provides a signal at an L level only when both of the two signals attain an H level. Inverter 232d receives the output signal from NAND gate 232c to provide the third clock signal $\Phi_3$ obtained by inversion of the applied signal, as shown in FIG. 3(d).

At a timing $t_{20}$ when the first clock signal $\Phi_1$ falls from an H level to an L level, as shown in FIG. 8(a), a substrate potential $V_{BB}$ of the semiconductor substrate is assumed to be a ground potential, as shown in FIG. 8(i).

When the first clock signal $\Phi_1$ falls from an H level to an L level at the timing $t_{20}$, as shown in FIG. 8(a), the second clock signal $\Phi_2$ rises from an L level to an H level, as shown in FIG. 8(c), while the third clock signal $\Phi_3$ is held at an L level, as shown in FIG. 8(d).

When the first clock signal $\Phi_1$ falling from an H level to an L level is applied to capacitor 240c in first charge pump circuit 240, a potential $N_7$ of seventh node 240b drops from an absolute value $V_{th6}$ of the threshold voltage of p-channel MOS transistor 240d connected between seventh node 240b and ground potential 240 to $(-k_1 V_{CC}+V_{th6})$, as shown in FIG. 8(f). As a result, p-channel MOS transistor 240d is rendered non-conductive, and p-channel MOS transistor 240e whose gate receives the potential $N_7$ of seventh node 240b is rendered conductive. This allows conduction between ground potential node 220 and first output node 250, whereby the potential $N_1$ of first output node 250 is a ground potential, rendering p-channel MOS transistor 240f non-conductive.

Thereafter, when the first clock signal $\Phi_1$ rises from an L level to an H level at a timing $t_{21}$, as shown in FIG. 8(a), the second clock signal $\Phi_2$ is held at an H level, as shown in FIG. 8(c), while the third clock signal $\Phi_3$ rises from an L level to an H level, as shown in FIG. 8(d). When the first clock signal $\Phi_1$ is applied to capacitor 240c in first charge pump circuit 240, the potential $N_7$ of seventh node 240b rises by capacitive coupling of capacitor 240c, as shown in FIG. 8(f).

When the potential $N_7$ exceeds the absolute value $V_{th6}$ of the threshold voltage of p-channel MOS transistor 240d connected between seventh node 240b and ground potential node 220, p-channel MOS transistor 240d is rendered conductive. This allows conduction between seventh node 240b and ground potential node 220, whereby the potential $N_7$ of seventh node 240b attains the absolute value $V_{th6}$ of the threshold voltage of p-channel MOS transistor 240d, so that p-channel MOS transistor 240e whose gate receives the potential $N_7$ is rendered non-conductive.

Simultaneously, when the third clock signal $\Phi_3$ is applied to capacitor 260e in first charge pump circuit 260, a potential $N_9$ of ninth node 260d rises by capacitive coupling of capacitor 260e, as shown in FIG. 8(a). When the potential $N_9$ exceeds an absolute value $V_{th7}$ of the threshold voltage p-channel MOS transistor 260f connected between ninth node 260d and ground potential node 220, p-channel MOS transistor 260f is rendered conductive. This allows conduction between ninth node 260d and ground potential node 220, whereby the potential $N_9$ of ninth node 260d attains the absolute value $V_{th7}$ of the threshold voltage of p-channel MOS transistor 260f, so that p-channel MOS transistor 260g whose gate receives the potential $N_9$ is rendered non-conductive.

When the inverted signal of the third clock signal $\Phi_3$ is applied to capacitor 260c by inverter 260a, a potential $N_8$ of eighth node 260b drops to $-k_2 V_{CC}$ by capacitive coupling of capacitor 260c, as shown in FIG. 8(g), rendering p-channel MOS transistor 260h conductive. This allows conduction between first node 240g and eighth node 260b, whereby the potential $N_1$ of first node 240g drops, as shown in FIG. 8(e). When the potential $N_1$ attains a third potential $(-k_2 V_{CC}+V_{th8})$ higher than the potential $-k_2 V_{CC}$ of eighth node 260b by an absolute value $V_{th8}$ of the threshold voltage of p-channel MOS transistor 260h, p-channel MOS transistor 260h is rendered non-conductive, and p-channel MOS transistor 240f whose gate receives the potential $N_1$ is rendered conductive. This allows conduction between the semiconductor substrate and first node 240g, whereby charges move from the semiconductor substrate to first node 240g. The substrate potential $V_{BB}$ of the semiconductor substrate slightly drops, as shown in FIG. 8(i), because of the large capacity of the substrate. The potential $N_1$ of first node 240g significantly rises because of the small capacity of the node, as shown in FIG. 8(e). When the potential $N_1$ attains a potential lower than the substrate potential $V_{BB}$ by an absolute value $V_{th9}$ of the threshold voltage of p-channel MOS transistor 240f, p-channel MOS transistor 240f is rendered non-conductive.

Thereafter, at a timing $t_{22}$, the second clock signal $\Phi_2$ provided from clock signal generating circuit 230 falls from an H level to an L level, as shown in FIG. 8(c), and the third clock signal $\Phi_3$ falls from an H level to an L level, as shown in FIG. 8(d). When the third clock signal $\Phi_3$ is applied to capacitor 260e in first charge pump circuit 260, the potential $N_9$ of ninth node 260d drops from $V_{th7}$ to $(-k_3 V_{CC}+V_{th7})$ by capacitive coupling of capacitor 260e, as shown in FIG. 8(h). Consequently, p-channel MOS transistor 260f is rendered non-conductive, and p-channel MOS transistor 260g whose gate receives the potential $N_9$ is rendered conductive. This allows conduction between ground potential node 220 and eighth node 260b, whereby the potential $N_8$ of eighth node 260b attains a ground potential, as shown in FIG. 8(g).

When the second clock signal $\Phi_2$ falling from an H level to an L level is applied to capacitor 240a in first charge pump circuit 240 at the timing $t_{22}$, the potential $N_1$ of first node 240g drops to $-(k_2+K_4) V_{CC}+V_{th8}$ (a second potential) by capacitive coupling of capacitor 240a, as shown in FIG. 8(e), rendering p-channel MOS transistor 240f conductive. This allows conduction between the semiconductor substrate and first node 240g, whereby charges move from the semiconductor substrate to first node 240g. The substrate potential $V_{BB}$ of the semiconductor substrate slightly drops because of the large capacity of the substrate, as shown in FIG. 8(i). The potential $N_1$ of first node 240g significantly rises because of the small capacity of the node, as shown in FIG. 8(e). When the potential $N_1$ attains a potential lower than the substrate potential $V_{BB}$ by the absolute value $V_{th9}$ of the threshold voltage of p-channel MOS transistor 240f, p-channel MOS transistor 240f is rendered non-conductive.

Thereafter, the first clock signal $\Phi_1$ falls again from an H level to an L level at a timing $t_{23}$, as shown in FIG. 8(a). After the timing $t_{23}$, the operation from the timing $t_{20}$ to the timing $t_{23}$ is repeated. As a result, the substrate potential $V_{BB}$ gradually drops, as shown in FIG. 8(i), to finally attain $-(k_2+k_4) V_{CC}+V_{th8}+V_{th9}$ at a timing $t_{24}$.

As can be seen from the above detailed description, in the substrate potential generating circuit according to the third embodiment, the potential $N_1$ of first node 240g is reduced to the first negative potential $(-k_2 V_{CC}+V_{th8})$ by second charge pump circuit 260 while the second clock signal $\Phi_2$ applied to first charge pump circuit 240 is at an H level, and then, when the second clock signal $\Phi_2$ falls from an H level to L level, the potential $N_1$ of first node 240g is further reduced from the first negative potential $(-k_2 V_{CC}+V_{th8})$ to the second negative potential $\{-(k_2+k_4) V_{CC}+V_{th8}\}$ by first charge pump circuit 240. Consequently, the substrate potential $V_{BB}$ of $\{=-(k_2+K_4) V_{CC}+V_{th8}+V_{th9}\}$, which is lower than the potential obtained when the potential $N_1$ of first node 240g directly drops from a ground potential, can be obtained.

A potential difference $\{(1+k_2+k_4) V_{CC}-V_{th8}\}$ is applied to a pn-junction between the source electrode of p-channel MOS transistor 260h connected to first node 240g, and the N-well. A potential difference $\{(1+k_2+k_4) V_{CC}-V_{th8}-V_{th9}\}$ is applied to a pn-junction between the source electrode of p-channel MOS transistor 240f connected to the semiconductor substrate, and the N-well. Accordingly, applied is a potential difference which is larger than the potential difference $\{(1+k_1) V_{CC}-V_{th2}\}$ applied between the source electrode connected to the semiconductor substrate of p-channel MOS transistor 47 and the N-well, in the conventional circuit shown in FIG. 9.

However, in the substrate potential generating circuit according to the third embodiment, even though the lower power supply potential $V_{CC}$ is applied, the substrate potential $V_{BB}$ lower by $(-k_2 V_{CC}+V_{th8})$ than the substrate potential $V_{BB}$ obtained in the conventional circuit can be obtained, whereby the same substrate potential $V_{BB}$ as in the conventional circuit can be obtained. Consequently, the potential difference applied to the pn-junction can be reduced.

For example, the case is considered that the substrate potential $V_{BB}$ of approximately $-3V$ is to be obtained where the coupling efficiency k is approximately 1 and the threshold voltage of the MOS transistor is 1.7V on the gate width of 0.5 $\mu$m. The substrate potential $V_{BB}$ drops to $(-k_1 V_{CC}+V_{th2})$ in the conventional circuit shown in FIG. 9, whereby the power supply potential $V_{CC}$ of 5V allows the substrate potential $V_{BB}$ of $-3.3V$, whereas, in the substrate potential generating circuit according to the third embodiment, the substrate potential $V_{BB}$ drops to $\{(-k_2+k_4)\ V_{CC}+V_{th8}+V_{th9}\}$, whereby the power supply potential $V_{CC}$ of 3.35V allows the substrate potential $V_{BB}$ of $-3.3V$.

The potential difference $\{(1+k_1)\ V_{CC}-V_{th2}\}$ applied to the pn-junction is 8.3V $\{=(1+1)\cdot 5-1.7\}$ in the conventional circuit, while in the third embodiment, the potential difference $\{(1+k_2+k_4)\ V_{CC}-V_{th8}\}$ is 8.35V $\{=(1+1+1)\cdot 3.35V-1.7\}$, and the other potential difference $\{(1+k_2+k_4)\ V_{CC}-V_{th9}-V_{th9}\}$ is 6.65V $\{=(1+1+1)\cdot 3.35-1.7-1.7\}$. It is thus possible to make the potential difference applied to the pn-junction equal to or lower than that applied in the conventional circuit.

As described above, according to the third embodiment, the substrate potential $V_{BB}$ of the deeper level can ben obtained as in the first and second embodiments, allowing wider selection for the substrate potential $V_{BB}$. Additionally, unless a required substrate potential is close to the limit of the capability of the substrate potential generating circuit, the substrate potential $V_{BB}$ can smoothly attain the required potential. The substrate potential $V_{BB}$ of the same degree as that in the conventional substrate potential generating circuit can be obtained in the case of the low power supply potential as well.

FOURTH EMBODIMENT

Figure 9:
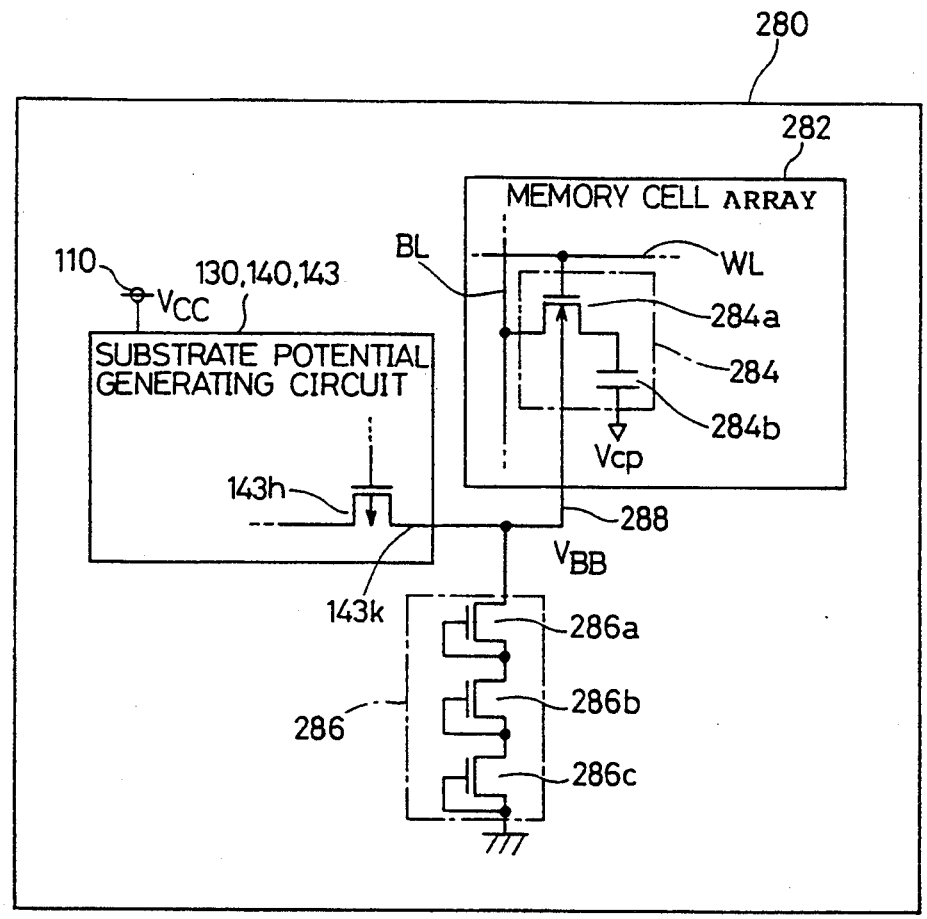
FIG. 9 is a block diagram showing the entire structure of a DRAM in accordance with a fourth embodiment of the present invention.
Figure 10:
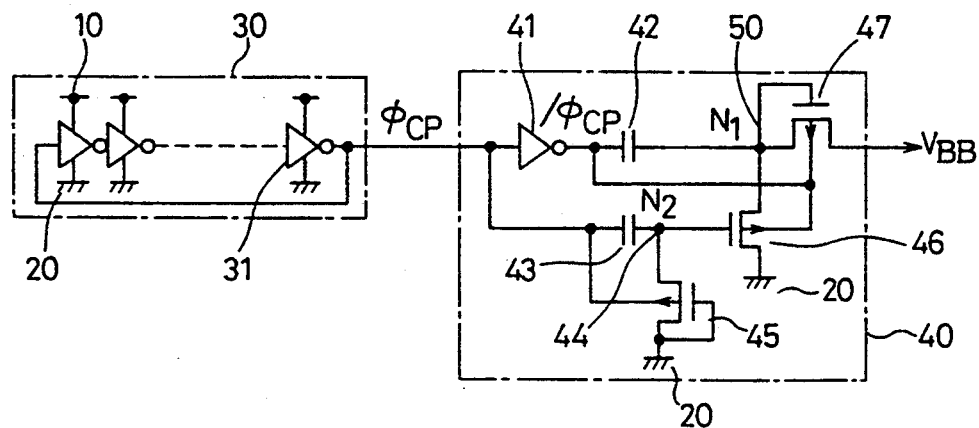
FIG. 10 is a schematic diagram showing the entire structure of a conventional substrate potential generating circuit.
Figure 11:
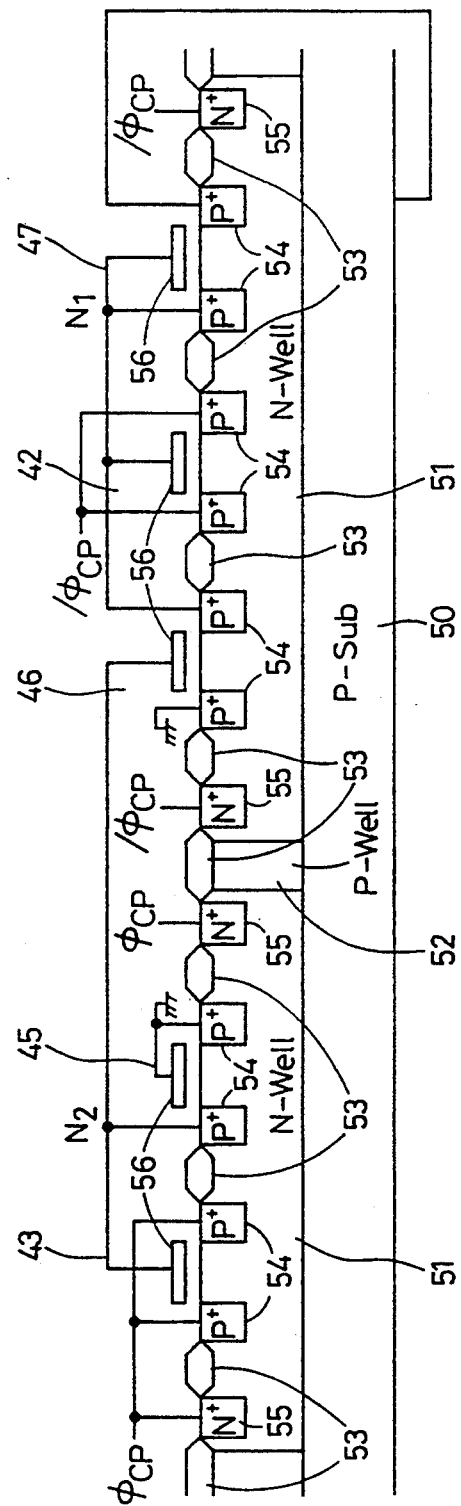
FIG. 11 is a partial cross sectional view of a semiconductor substrate on which the substrate potential generating circuit shown in FIG. 10 is formed.
Figure 12:
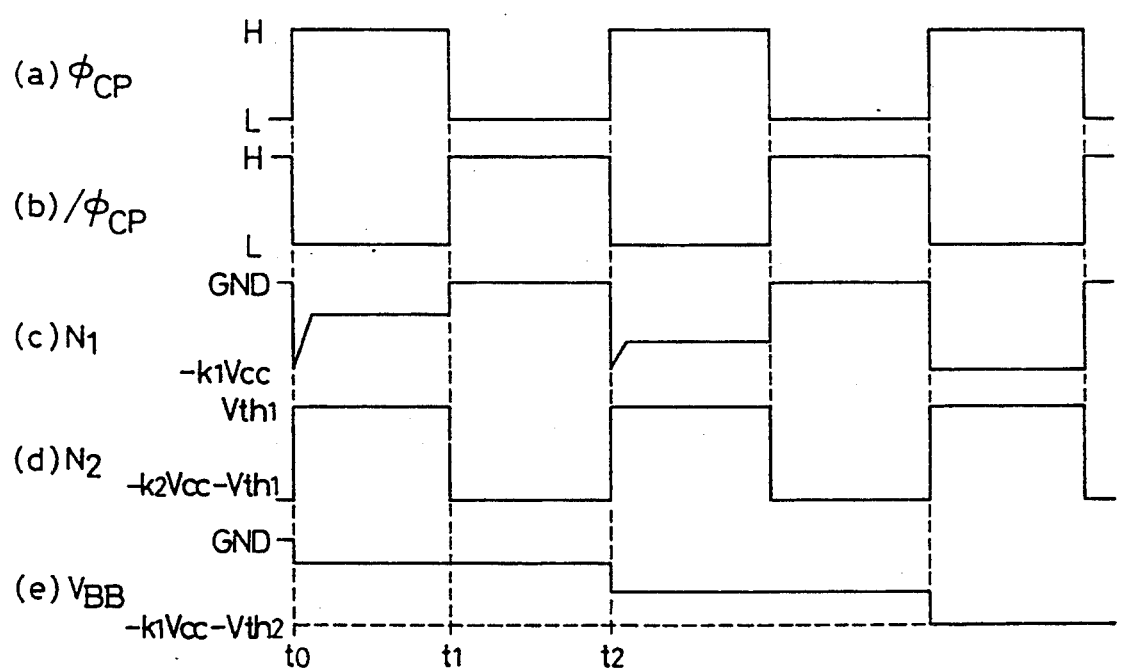
FIG. 12 is a timing chart showing the operation of the substrate potential generating circuit shown in FIG. 10.

FIG. 9 is a block diagram showing the entire structure of a dynamic random access memory (DRAM) in accordance with a fourth embodiment of the present invention.

Referring to FIG. 9, DRAM 280 includes substrate potential generating circuit 130, 140, 143 in accordance with the first embodiment, a memory cell array 282, and a cramp circuit 286. Substrate potential generating circuit 130, 140, 143, memory cell array 282 and cramp circuit 286 are formed on a single semiconductor substrate.

Substrate potential generating circuit 130, 140, 143 is that shown in FIG. 1, including an output node 143k connected to the semiconductor substrate through a wiring of aluminum, polysilicon, a diffusion layer or the like, and a circuit responsive to a power supply potential $V_{CC}$ for applying to output node 143k a negative potential $-k_2\ V_{CC}$ having an absolute value approximately equal to that of the power supply potential.

Memory cell array 282 includes a plurality of memory cells 284 arranged in a matrix of rows and columns. Memory cell 284 includes an n-channel MOS transistor 284a and a capacitor 284b.

n-channel MOS transistor 284a has its drain/source electrode connected to one electrode of capacitor 284b, its source/drain electrode connected to a bit line BL, and its gate electrode connected to a word line WL. Capacitor 284b stores 1-bit data, the other electrode of which is supplied with a cell plate voltage $V_{CP}$.

Cramp circuit 286 includes diode-connected n-channel MOS transistors 286a, 286b and 286c. Transistors 286a to 286c are connected in series between output node 143k of substrate potential generating circuit 130, 140, 143 and a grand node. Consequently, cramp circuit 286 prevents a potential $V_{BB}$ of the semiconductor substrate from reducing to a predetermined potential or less.

Cramp circuit 286 is provided in this embodiment, though it may not be necessarily provided, for the following reason.

The case will be considered where the semiconductor substrate is supplied with $-1.5V$ in order to set the threshold voltage of n-channel MOS transistor 284a in memory cell 284 to a predetermined value, for example. Assuming that the power supply potential $V_{CC}$ is 3.3V, and the absolute value of the threshold voltage of p-channel MOS transistor 143h in substrate potential generating circuit 130, 140, 143 is 1.0V, substrate potential generating circuit 130, 140, 143 of the present invention can generate $-3.3V$, while the conventional substrate potential generating circuit can generate $-2.3V$ $(=-3.3+1.0)$.

Cramp circuit 286 prevents the substrate potential $V_{BB}$ from being not higher than $-1.5V$, so that the semiconductor substrate is supplied with $-1.5V$.

Assuming that the power supply potential $V_{CC}$ is 1.5V, substrate potential generating circuit 130, 140, 143 of the present invention can generate $-1.5V$, while the conventional substrate potential generating circuit can generate no more than $-0.5V$ $(=-1.5+1.0)$. Accordingly, a sub-threshold leak current increases because of the small threshold voltage of n-channel MOS transistor 284a in the conventional substrate potential generating circuit, whereas such a problem does not arise in DRAM 280 of the present invention.

In this embodiment, DRAM 180 is a semiconductor device. Memory cell array 282 is an internal circuit. Cramp circuit 286 may have any structure so long as it prevents the substrate potential $V_{BB}$ from reducing to a predetermined potential or less.

Additionally, substrate potential generating circuit 130, 140, 243, in the second embodiment, or substrate potential generating circuit 230, 240, 260 in the third embodiment may be provided instead of substrate potential generating circuit 130, 140, 143.

As described above, a negative potential having the absolute value equal to that of the power supply potential can be applied to the semiconductor substrate by providing the substrate potential generating circuit in accordance with the present invention in the DRAM.

ANOTHER EMBODIMENT

Although the potential $N_2$ of second output node 160 drops to $-(k_1+k_3)\ V_{CC}+V_{th4}$ between the timings $t_{11}$ and $t_{12}$ in the first and second embodiments, it is only necessary for turning on of p-channel MOS transistor 143h that the potential $N_2$ is lower than $-k_1\ V_{CC}$ by the absolute value $V_{th5}$ of the threshold voltage of p-channel MOS transistor 143h. The potential $N_2$ may be reduced to or below $(-k_1\ V_{CC}-V_{th5})$ through provision of a clamping circuit, or adjustment of the coupling efficiency k.

In addition, a reference potential is supplied to the p-type semiconductor substrate in the above embodiment, while the same effect can be obtained by supply of a reference potential to a P-well.

Furthermore, while various clock signals have been described in the first to third embodiments, the present invention is not to be limited to these clock signals. Specifically, any clock signal may be employed in the first and second embodiments as long as it can reduce the potential $N_1$ of the gate electrode so as to turn on p-channel MOS transistor 143h, when the potential $N_1$ of first node 143j is reduced. Also, any clock signal may be employed in the third embodiment, as long as it can further reduce the potential $N_1$ so as to turn on p-channel MOS transistor 143h, when the potential $N_1$ of first node 240g is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate potential generating circuit for applying a negative potential to a semiconductor substrate, comprising:

first charge pump means including
a p-channel MOS transistor having the source electrode connected to said semiconductor substrate, and
applying means for applying a first negative potential to the drain electrode of said p-channel MOS transistor; and
control means for applying a second negative potential lower than the first negative potential to the gate electrode of said p-channel MOS transistor during a prescribed period,
wherein said control means includes second charge pump means for applying the second negative potential lower than the first negative potential at least by an absolute value of the threshold voltage of said p-channel MOS transistor to the gate electrode of said p-channel MOS transistor during the whole or a part of a period when the first negative potential is applied to the drain electrode of said p-channel MOS transistor, to turn on said p-channel MOS transistor, allowing conduction between the source electrode and the drain electrode; and
said second charge pump means includes
first sub-charge pump means for applying a third negative potential to the gate electrode of said p-channel MOS transistor and
second sub-charge pump means for applying to the gate electrode of said p-channel MOS transistor the second negative potential lower than the third negative potential applied to the gate electrode of said p-channel MOS transistor, and lower than the first negative potential applied to the drain electrode of said p-channel MOS transistor at least by the absolute value of the threshold voltage of said p-channel MOS transistor.

2. A substrate potential generating circuit for applying a negative potential to a semiconductor substrate, comprising:

ring oscillating means including an odd number of inverters connected in a ring, for generating a first clock signal periodically changing between a first logic level and a second logic level;
clock waveform changing means responsive to said first clock signal for generating
a second clock signal obtained by inversion of the first clock signal,
a third clock signal changing from the first logic level to the second logic level a prescribed time period after a timing when the second clock signal changes from the first logic level to the second logic level, and changing from the second logic level to the first logic level at the timing when the second clock signal changes from the second logic to the first logic level, and
a fourth clock signal changing from the first logic level to the second logic level at the timing when the second clock signal changes from the first logic level to the second logic level, and changing from the second logic level to the first logic level at a timing when the third clock signal changes from the first logic level to the second logic level;
first charge pump means including
a p-channel MOS transistor having the source electrode connected to said semiconductor substrate, and
applying means responsive to said first and third clock signals for applying a ground potential to the drain electrode of said p-channel MOS transistor during a period when the first clock signal is at the second logic level, and applying a first negative potential to the drain electrode of said p-channel MOS transistor at a timing when the third clock signal changes from the first logic level to the second logic level;
second charge pump means responsive to said fourth clock signal for applying a third negative potential to the gate electrode of said p-channel MOS transistor during a period when the fourth clock signal is at the second logic level; and
third charge pump means responsive to said second and third clock signals for applying the ground potential to the gate electrode of said p-channel MOS transistor during a period when the second clock signal is at the first logic level, and applying to the gate electrode of said p-channel MOS transistor a second negative potential lower than the third negative potential provided from said second charge pump means, and lower than the first negative potential provided from said first charge pump means at least by an absolute value of the threshold voltage of said p-channel MOS transistor, at the timing when said third clock signal changes from the first logic level to the second logic level.

3. A substrate potential generating circuit for applying a negative potential to a semiconductor substrate, comprising:

ring oscillating means including an odd number of inverters connected in a ring, for generating a first clock signal periodically changing between a first logic level and a second logic level;
clock waveform changing means responsive to said first clock signal for generating
a second clock signal obtained by inversion of the first clock signal,
a third clock signal changing from the first logic level to the second logic level, a prescribed time period after a timing when the second clock signal changes from the first logic level to the second logic level, and changing from the second logic level to the first logic level at a timing when the second clock signal changes from the second logic level to the first logic level, and
a fourth clock signal changing from the first logic level to the second logic level at the timing when the second clock signal changes from the first logic level to the second logic level, and changing from the second logic level to the first logic level at a timing when the third clock signal changes from the first logic level to the second logic level;
first charge pump means including
a p-channel MOS transistor having the source electrode connected to said semiconductor substrate, and applying means responsive to said first and second clock signals for applying a ground potential to the drain electrode of said p-channel MOS transistor during a period when the first clock signal is at the second logic level, and applying a first negative potential to the drain electrode of said p-channel MOS transistor at the timing when the second clock signal changes from the first logic level to the second logic level;

second charge pump means responsive to said fourth clock signal for applying a third negative potential to the gate electrode of said p-channel MOS transistor during a period when the fourth clock signal is at the second logic level; and third charge pump means responsive to said second and third clock signals for applying the ground potential to the gate electrode of said p-channel MOS transistor during a period when the second clock signal is at the first logic level, and applying to the gate electrode of said p-channel MOS transistor a second negative potential lower than the third negative potential provided from said second charge pump means, and lower than the first negative potential provided from said first charge pump means at least by the absolute value of the threshold voltage of said p-channel MOS transistor, at the timing when said third clock signal changes from the first logic level to the second logic level.

4. A substrate potential generating circuit for applying a first negative potential to a semiconductor substrate, comprising:

ring oscillating means including an odd number of inverters connected in a ring, for generating a first clock signal periodically changing between a first logic level and a second logic level;

clock waveform changing means responsive to said first clock signal for generating a second clock signal changing from the first logic level to the second logic level at a timing when the first clock signal changes from the second logic level to the first logic level, and changing from the second logic level to the first logic level, a prescribed time period after a timing when the first clock signal changes from the first logic level to the second logic level and a third clock signal changing from the first logic level to the second logic level at the timing when the first clock signal changes from the first logic level to the second logic level, and changing from the second logic level to the first logic level at a timing when the second clock signal changes from the second logic level to the first logic level;

first charge pump means including a p-channel MOS transistor having its drain electrode and its gate electrode connected to each other and its source electrode connected to said semiconductor substrate; and second charge pump means responsive to said third clock signal for applying to the drain electrode and the gate electrode of said p-channel MOS transistor a second negative potential at a timing when the third clock signal changes from the first logic level to the second logic level;

wherein said first charge pump means further includes applying means responsive to said first and second clock signals for applying a ground potential to the drain electrode and the gate electrode of said p-channel MOS transistor during a period when the first clock signal is at the first logic level, and applying to the drain electrode and the gate electrode of said p-channel MOS transistor a third negative potential lower than said second negative potential, and lower than the first negative potential to be applied to said semiconductor substrate at least by an absolute value of the threshold voltage of said p-channel MOS transistor at the timing when the second clock signal changes from the second logic level to the first logic level.

* * * * *